(12) United States Patent
Scheffer

(10) Patent No.: US 8,201,128 B2
(45) Date of Patent: Jun. 12, 2012

(54) METHOD AND APPARATUS FOR APPROXIMATING DIAGONAL LINES IN PLACEMENT

(75) Inventor: Louis K. Scheffer, Campbell, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 87 days.

(21) Appl. No.: 11/424,840

(22) Filed: Jun. 16, 2006

(65) Prior Publication Data

US 2008/0005711 A1    Jan. 3, 2008

(51) Int. Cl.
*G06F 17/50* (2006.01)
(52) U.S. Cl. ........................................................ 716/124
(58) Field of Classification Search .............. 716/7, 124, 716/125, 131
See application file for complete search history.

(56) References Cited

U.S. PATENT DOCUMENTS

| | | |
|---|---|---|
| 4,782,193 A | 11/1988 | Linsker |
| 4,855,253 A | 8/1989 | Weber |
| 5,117,277 A | 5/1992 | Yuyama et al. |
| 5,481,473 A | 1/1996 | Kim et al. |
| 5,491,641 A | 2/1996 | Scepanovic et al. |
| 5,532,934 A | 7/1996 | Rostoker |
| 5,541,005 A | 7/1996 | Bezama et al. |
| 5,635,736 A | 6/1997 | Funaki et al. |
| 5,637,920 A | 6/1997 | Loo |
| 5,640,327 A | 6/1997 | Ting |
| 5,646,830 A | 7/1997 | Nagano |
| 5,650,653 A | 7/1997 | Rostoker et al. |
| 5,673,201 A | 9/1997 | Malm et al. |
| 5,689,433 A | 11/1997 | Edwards |
| 5,723,908 A | 3/1998 | Fuchida et al. |
| 5,742,510 A | 4/1998 | Rostoker et al. |
| 5,784,289 A | 7/1998 | Wang |
| 5,801,385 A | 9/1998 | Endo et al. |
| 5,811,863 A | 9/1998 | Rostoker et al. |
| 5,822,214 A | 10/1998 | Rostoker et al. |
| 5,880,969 A | 3/1999 | Hama et al. |
| 5,889,329 A | 3/1999 | Rostoker et al. |
| 5,973,376 A | 10/1999 | Rostoker et al. |

(Continued)

FOREIGN PATENT DOCUMENTS

JP    04-000677    1/1992

(Continued)

OTHER PUBLICATIONS

Roy et al., Capo: Robust and Scalable Open-Source Min-cut Floorplacer, Proc. Intl. Symposium on Physical Design (ISPD), Apr. 2005, pp. 224-227.*

(Continued)

*Primary Examiner* — Vuthe Siek
*Assistant Examiner* — Aric Lin
(74) *Attorney, Agent, or Firm* — Adeli & Tollen LLP

(57) ABSTRACT

Some embodiments of the invention provide a method for placing circuit modules in an integrated circuit ("IC") layout. The method computes a placement metric for the IC layout. In some embodiments, computing the placement metric includes partitioning a region of the IC layout into several sub-regions by using a cut graph, where the cut graph is an approximation of a diagonal cut line. These embodiments then generate congestion-cost estimates by measuring the number of nets cut by the cut graph. In some embodiments, the cut graph is a staircase cut graph. These staircase cut graphs include several horizontal and vertical cut lines. In some embodiments, the cut graph is a cut arc.

12 Claims, 29 Drawing Sheets

U.S. PATENT DOCUMENTS

| | | | |
|---|---|---|---|
| 5,980,093 | A | 11/1999 | Jones et al. |
| 6,111,756 | A | 8/2000 | Moresco |
| 6,150,193 | A | 11/2000 | Glenn |
| 6,186,676 | B1 | 2/2001 | Andreev et al. |
| 6,260,183 | B1 | 7/2001 | Raspopovic et al. |
| 6,262,487 | B1 | 7/2001 | Igarashi et al. |
| 6,263,475 | B1 | 7/2001 | Toyonaga et al. |
| 6,301,686 | B1 | 10/2001 | Kikuchi et al. |
| 6,307,256 | B1 | 10/2001 | Chiang et al. |
| 6,316,838 | B1 | 11/2001 | Ozawa et al. |
| 6,324,674 | B2 | 11/2001 | Andreev et al. |
| 6,353,918 | B1 | 3/2002 | Carothers et al. |
| 6,411,494 | B1 | 6/2002 | Watt |
| 6,412,097 | B1 | 6/2002 | Kikuchi et al. |
| 6,448,591 | B1 | 9/2002 | Juengling |
| 6,516,455 | B1 | 2/2003 | Teig et al. |
| 6,564,366 | B1 | 5/2003 | Marchenko et al. |
| 6,591,405 | B1 * | 7/2003 | Doddi ............................ 716/7 |
| 6,645,842 | B2 | 11/2003 | Igarashi et al. |
| 6,651,233 | B2 | 11/2003 | Teig et al. |
| 6,678,872 | B2 | 1/2004 | Teig et al. |
| 6,826,737 | B2 | 11/2004 | Teig et al. |
| 6,845,495 | B2 | 1/2005 | Andreev et al. |
| 6,848,091 | B2 | 1/2005 | Teig et al. |
| 6,858,928 | B1 | 2/2005 | Teig et al. |
| 6,915,500 | B1 | 7/2005 | Teig et al. |
| 7,024,650 | B2 | 4/2006 | Teig et al. |
| 7,036,105 | B1 | 4/2006 | Teig et al. |
| 7,055,120 | B2 | 5/2006 | Teig et al. |
| 7,065,729 | B1 | 6/2006 | Chapman |
| 7,089,523 | B2 | 8/2006 | Teig et al. |
| 7,155,693 | B1 * | 12/2006 | Rodman ...................... 716/122 |
| 2001/0009031 | A1 | 7/2001 | Nitta et al. |
| 2002/0069397 | A1 * | 6/2002 | Teig et al. ...................... 716/12 |
| 2002/0155656 | A1 | 10/2002 | Hayano et al. |
| 2002/0182844 | A1 | 12/2002 | Igarashi et al. |
| 2003/0025205 | A1 | 2/2003 | Shively |
| 2005/0240893 | A1 * | 10/2005 | Teig et al. ...................... 716/13 |
| 2005/0240894 | A1 | 10/2005 | Teig et al. |
| 2006/0010412 | A1 | 1/2006 | Teig et al. |

FOREIGN PATENT DOCUMENTS

| | | |
|---|---|---|
| JP | 2000-082743 | 3/2000 |
| TW | 200807268 | 2/2008 |
| WO | WO 2007/147147 | 12/2007 |

OTHER PUBLICATIONS

Ng et al., "Solving Hard Instances of Floorplacement", International Symposium on Physical Design, Apr. 2006.*

International Search Report and Written Opinion for PCT/US2007/071397, Nov. 18, 2008 (mailing date), Cadence Design Systems, Inc.

International Preliminary Report for PCT/US2007/071397, Dec. 31, 2008 (mailing date), Cadence Design Systems, Inc.

Portions of prosecution history of U.S. Appl. No. 10/329,241, Aug. 16, 2004, Teig, Steven, et al.

Portions of prosecution history of U.S. Appl. No. 09/972,011, Mar. 30, 2005, Teig, Steven, et al.

Portions of prosecution history of U.S. Appl. No. 10/046,858, Jun. 27, 2005, Teig, Steven, et al.

Portions of prosecution history of U.S. Appl. No. 09/731,891, Sep. 6, 2005, Teig, Steven, et al.

Portions of prosecution history of U.S. Appl. No. 09/737,245, Mar. 1, 2006, Teig, Steven, et al.

Portions of prosecution history of U.S. Appl. No. 11/031,348, Nov. 29, 2007, Teig, Steven, et al.

Royle, J., et al. "Geometrical Compaction in One Dimension for Channel Routing", Proceeding of the 24th ACM IEEE Design Automation Conference, Oct. 1987, pp. 140-145, Miami Beach, FL.

Tseng, Tseng Hsiao-Ping, et al., "A Gridless Multilayer Router for Standard Cell Circuits Using CTM Cells", IEEE Transactions on Computer-Aided Design of Integrated Circuits and Systems, Oct. 1999, pp. 1462-1479, vol. 18, Issue 10.

Merriam-Webster's Collegiate Dictionary, $10^{th}$ edition, (Month N/A) 1993, p. 606, Merriam-Webster Incorporated.

Cong, Jason, et al., "DUNE: A Multilayer Gridless Routing System", IEEE Transactions on Computer-Aided Design of Integrated Circuits and Systems, May 2001, pp. 633-647, vol. 20, No. 5.

Dion, Jeremy, et al., "Contour: A Tile-based Gridless Router", WRL Research Report 95/3, Mar. 1995, pp. 1-22, Digital Western Research Laboratory, Palo Alto, CA.

"Use of Relatively Diagonal and Rectangular Wiring Planes in Multilayer Packages", IBM Technical Disclosure Bulletin, TDB-ACC-NO: NN71091316, Sep. 1971, pp. 1316-1317, vol. No. 14, Issue No. 4.

Schiele, W. L., et al., "A Gridless Router for Industrial Design Rules", Proceedings of the 27th ACM/IEEE Design Automation Conference, Jun. 24-28, 1990, pp. 626-631, Orlando, FL.

Chen, C. Y. Roger, et al., "Optimal Algorithms for Bubble Sort Based Non-Manhattan Channel Routing", IEEE Transactions on Computer-Aided Design of Integrated Circuits and Systems, May 1994, pp. 603-609, vol. 13, No. 5.

Morton, Paul B., et al., "An Efficient Sequential Quadratic Programming Formulation of Optimal Wire Spacing for Cross-Talk Noise Avoidance Routing", Proceedings of the 1999 International Symposium on Physical Design, Mar. 10, 1999, pp. 22-28, Monterey, CA.

Yan, Jin-Tai, "Three-Layer Bubble-Sorting-Based NonManhattan Channel Routing", ACM Transactions on Design Automation of Electronic Systems, Jul. 2000, pp. 726-734, vol. 5, No. 3.

Chen, Hongyu, et al., "Physical Planning of On-Chip Interconnect Architectures", Proceeding of the 2002 IEEE International Conference on Computer Design, Sep. 16-18, 2002, pp. 30-35, Freiburg, Germany.

* cited by examiner

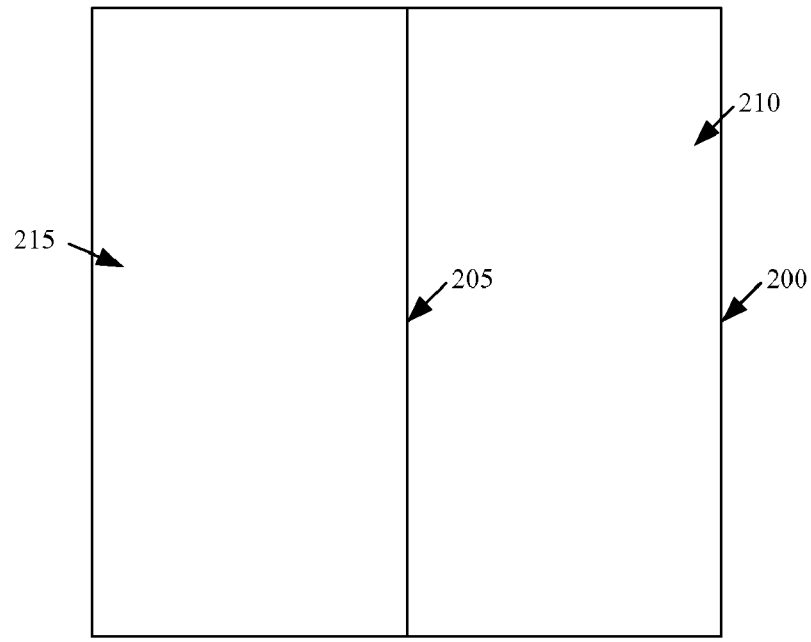
*Figure 2*     (Prior Art)
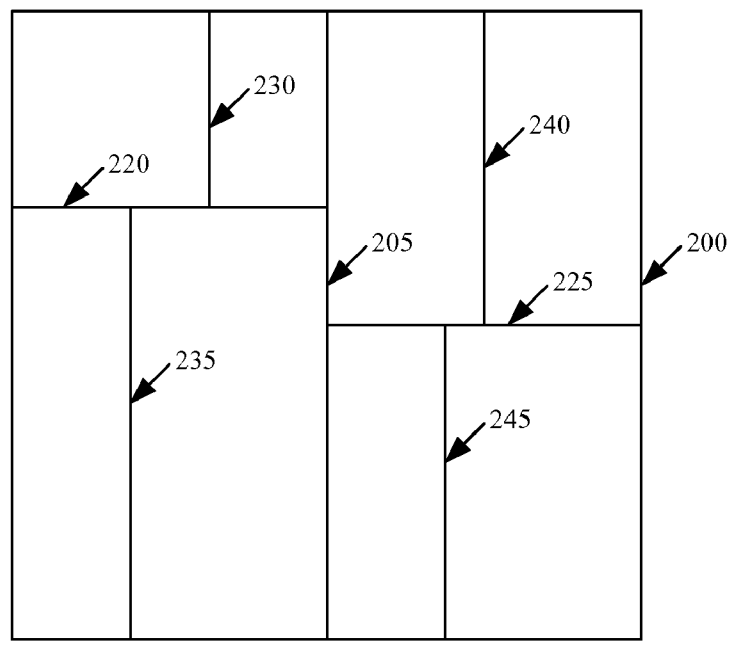
*Figure 3*     (Prior Art)

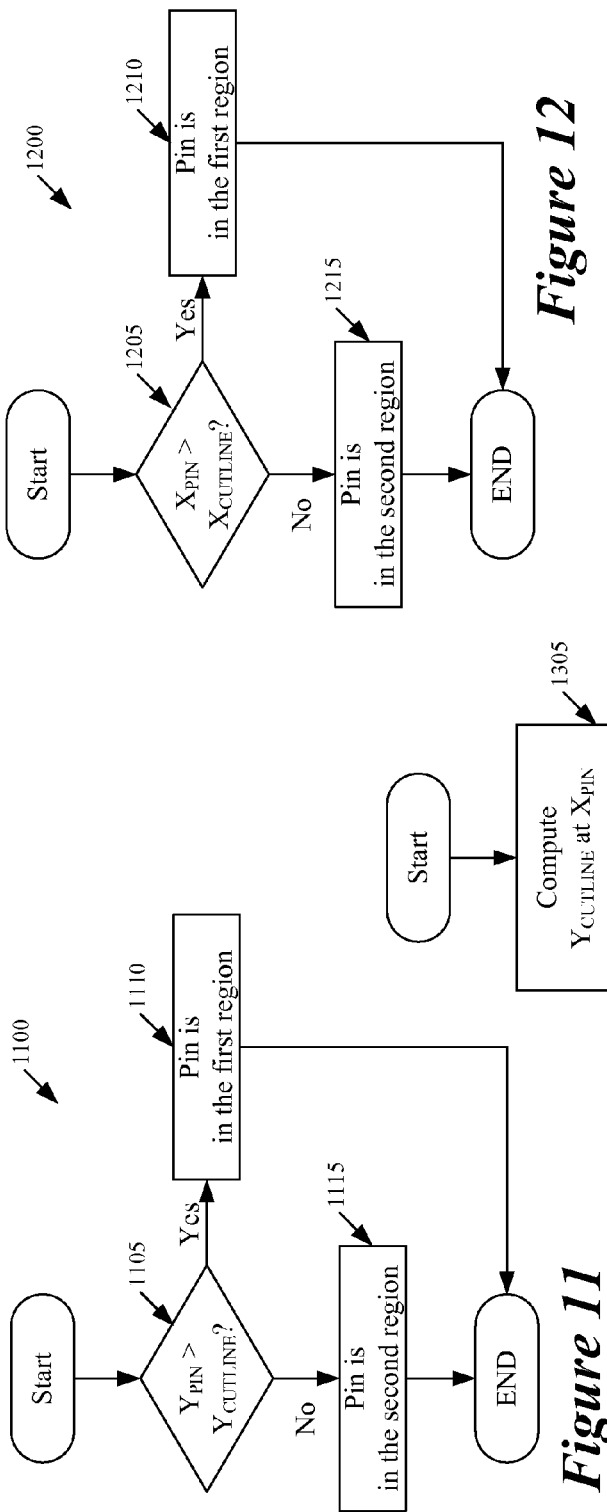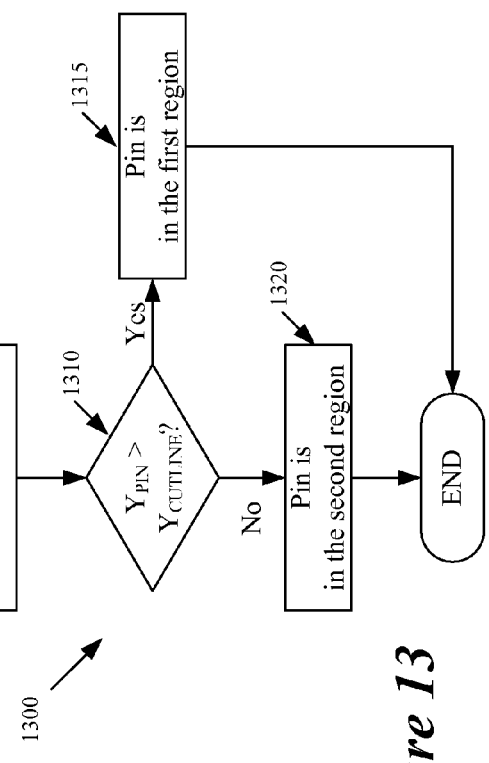

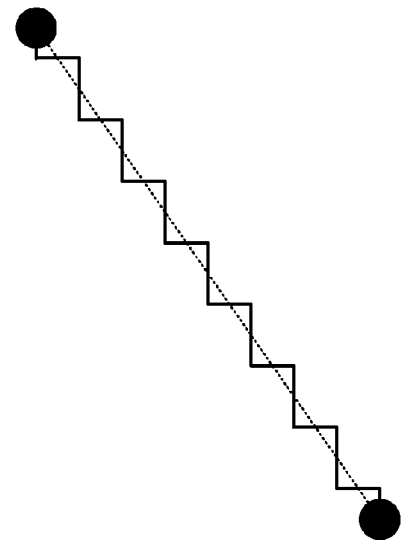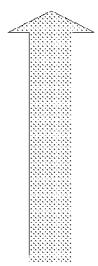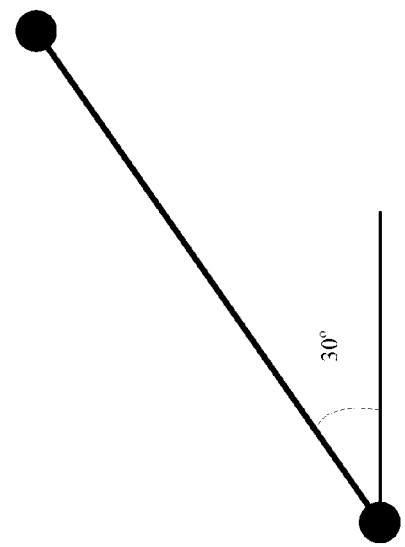
*Figure 15*

METHOD AND APPARATUS FOR APPROXIMATING DIAGONAL LINES IN PLACEMENT

FIELD OF THE INVENTION

Some embodiments of the invention provide a method for approximating diagonal lines in placement.

BACKGROUND OF THE INVENTION

An integrated circuit ("IC") is a semiconductor device that includes many electronic components (e.g., transistors, resistors, diodes, etc.). These components are often interconnected to form multiple circuit components (e.g., gates, cells, memory units, arithmetic units, controllers, decoders, etc.) on the IC. The electronic and circuit components of IC's are jointly referred to below as "components."

An IC also includes multiple layers of metal and/or polysilicon wiring (collectively referred to below as "metal layers") that interconnect its electronic and circuit components. For instance, many IC's are currently fabricated with five metal layers. In theory, the wiring on the metal layers can be all-angle wiring (i.e., the wiring can be in any arbitrary direction). Such all-angle wiring is commonly referred to as Euclidean wiring. In practice, however, each metal layer typically has a preferred wiring direction, and the preferred direction alternates between successive metal layers. Many IC's use the Manhattan wiring model, which specifies alternating layers of preferred-direction horizontal and vertical wiring. In this wiring model, the majority of the wires can only make 90° turns. However, occasional diagonal jogs are sometimes allowed on the preferred horizontal and vertical layers.

Design engineers design IC's by transforming circuit description of the IC's into geometric descriptions, called layouts. To create layouts, design engineers typically use electronic design automation ("EDA") applications. These applications provide sets of computer-based tools for creating, editing, and analyzing IC design layouts.

EDA applications create layouts by using geometric shapes that represent different materials and devices on IC's. For instance, EDA tools commonly use rectangular lines to represent the wire segments that interconnect the IC components. These tools also represent electronic and circuit IC components as geometric objects with varying shapes and sizes. For the sake of simplifying the discussion, these geometric objects are shown as rectangular blocks in this document.

Also, in this document, the phrase "circuit module" refers to the geometric representation of an electronic or circuit IC component by an EDA application. EDA applications typically illustrate circuit modules with pins on their sides. These pins connect to the interconnect lines.

A net is typically defined as a collection of pins that need to be electrically connected. A list of all or some of the nets in a layout is referred to as a net list. In other words, a net list specifies a group of nets, which, in turn, specify the interconnections between a set of pins.

FIG. 1 illustrates an example of an IC layout 100. This layout includes five circuit modules 105, 110, 115, 120, and 125 with pins 130-160. Four interconnect lines 165-180 connect these modules through their pins. In addition, three nets specify the interconnection between the pins. Specifically, pins 135, 145, and 160 define a three-pin net, while pins 130 and 155, and pins 140 and 150 respectively define two two-pin nets. As shown in FIG. 1, a circuit module (such as 105) can have multiple pins on multiple nets.

The IC design process entails various operations. Some of the physical-design operations that EDA applications commonly perform to obtain the IC layouts are: (1) circuit partitioning, which partitions a circuit if the circuit is too large for a single chip; (2) floor planning, which finds the alignment and relative orientation of the circuit modules; (3) placement, which determines more precisely the positions of the circuit modules; (4) routing, which completes the interconnects between the circuit modules; (5) compaction, which compresses the layout to decrease the total IC area; and (6) verification, which checks the layout to ensure that it meets design and functional requirements.

Placement is a key operation in the physical design cycle. It is the process of arranging the circuit modules on a layout, in order to achieve certain objectives, such as reducing layout area, wirelength, wire congestion, etc. A poor placement configuration not only can consume a large area, but it also can make routing difficult and result in poor performance.

Numerous EDA placers have been proposed to date. Certain placers are constrained-optimization placers, which (1) use cost-calculating functions to generate placement scores (i.e., placement costs) that quantify the quality of placement configurations, and (2) use optimization algorithms to modify iteratively the placement configurations to improve the placement scores generated by the cost-calculating functions.

A constrained-optimization placer typically receives (1) a list of circuit modules, (2) an initial placement configuration for these modules, and (3) a net list that specifies the interconnections between the modules. The initial placement configuration can be random (i.e., all the modules can be positioned randomly). Alternatively, the initial configuration can be partially or completely specified by a previous physical-design operation, such as the floor planning.

A constrained-optimization placer then uses a cost-calculating function to measure the quality of the initial placement configuration. The cost function generates a metric score that is indicative of the placement quality. Different cost-calculating functions measure different placement metrics. For instance, as further described below, some functions measure congestion (e.g., measure number of nets intersected by cut lines).

After calculating the metric cost of the initial placement configuration, a constrained-optimization placer uses an optimization algorithm to modify iteratively the placement configuration to improve the placement score generated by its cost-calculating function. Different optimization techniques modify the placement configuration differently. For instance, at each iteration, some techniques move one circuit module, others swap two modules, and yet others move a number of related modules. Also, at each iteration, some optimization techniques (e.g., KLFM and tabu search algorithms) search for the best move, while others (e.g., simulated annealing and local optimization) select random moves. In addition, some techniques (e.g., simulated annealing) accept moves that make the metric score worse, whereas others (e.g., local optimization) do not.

One type of constrained-optimization placement technique uses min-cut bipartitioning. This technique uses horizontal and vertical cut lines to partition the IC layout recursively into successive pairs of regions. At each level of the recursion, this technique then moves the circuit modules between the regions at that level, in order to reduce the number of nets intersected by the cut line for that level. By minimizing the net-cut cost at each level of the recursion, these techniques reduce the wire congestion across the cut lines.

FIGS. 2 and 3 illustrate one example of min-cut bipartitioning. FIG. 2 illustrates an IC layout 200 that is partitioned initially in two regions 210 and 215 by a vertical cut line 205. After defining this initial cut line, the min-cut bipartitioning method calculates the number of nets that are intersected by this cut line. This number is indicative of the wire congestion about this cut line. An optimization algorithm (such as KLFM) is then used to modify the initial placement iteratively (i.e., to move the circuit modules iteratively), in order to minimize the net-cut cost across the initial cut line 205.

Once the congestion across the initial cut line is minimized, the min-cut bipartitioning method is applied recursively to the two regions created by the initial cut line, and then it is applied to the resulting regions created by the succeeding cut lines, and so on. FIG. 3 illustrates the IC layout 200 after it has been recursively partitioned by seven cut lines 205 and 220-245.

The above-described placement techniques do not consider diagonal wiring in calculating their placement-configuration cost. Hence, when diagonal routes are selected for the interconnect lines, these techniques result in poor placement configurations, which inefficiently consume the layout area, utilize too much wire, and/or have poor wire congestions. Consequently, there is a need in the art for placers that consider diagonal wiring in calculating their placement-configuration costs.

BRIEF SUMMARY OF THE INVENTION

Some embodiments of the invention provide a method for placing circuit modules in an integrated circuit ("IC") layout. The method computes a placement metric for the IC layout. In some embodiments, computing the placement metric includes partitioning a region the IC layout into several sub-regions by using a cut graph, where the cut graph is an approximation of a diagonal cut line. These embodiments then generate congestion-cost estimates by measuring the number of nets cut by the cut graph.

In some embodiments, the cut graph is a staircase cut graph. These staircase cut graphs include several horizontal and vertical lines. In some embodiments, the cut graph is a cut arc.

BRIEF DESCRIPTION OF THE SEVERAL VIEWS OF THE DRAWINGS

The novel features of the invention are set forth in the appended claims. However, for purpose of explanation, several embodiments of the invention are set forth in the following figures.

FIG. 2 illustrates an IC layout that is partitioned initially in two regions by a vertical cut line.

FIG. 3 illustrates the IC layout of FIG. 2 after it has been recursively partitioned by seven cut lines.

FIGS. 11, 12, and 13 illustrate three processes for identifying a region for a pin.

FIG. 15 illustrates Manhattan cut line segments of a staircase cut graph with various lengths.

DETAILED DESCRIPTION OF THE INVENTION

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Some embodiments of the invention provide a method for placing circuit modules in an integrated circuit ("IC") layout. The method computes a placement metric for the IC layout. The placement metric takes into account diagonal routes. In some embodiments, computing the placement metric includes partitioning a region the IC layout into several sub-regions by using a cut graph, where the cut graph is an approximation of a diagonal cut line. These embodiments then generate congestion-cost estimates by measuring the number of nets cut by the cut graph.

In some embodiments, the cut graph is a staircase cut graph. These staircase cut graphs include several horizontal and vertical cut lines. In some embodiments, the cut graph is a cut arc.

I. Diagonal Wiring Architecture

Some embodiments of the invention calculate the cost of placement configurations for IC layouts that have diagonal interconnect lines (i.e., diagonal wiring). In some of these embodiments, the IC layouts not only have diagonal interconnect lines, but also have horizontal and vertical interconnect lines.

As used in this document, an interconnect line is "diagonal" if it forms an angle other than zero or ninety degrees with respect to one of the sides of the layout boundary. On the other hand, an interconnect line is "horizontal" or "vertical" if it forms an angle of 0° or 90° with respect to one of the sides of the layout.

Figure 1:
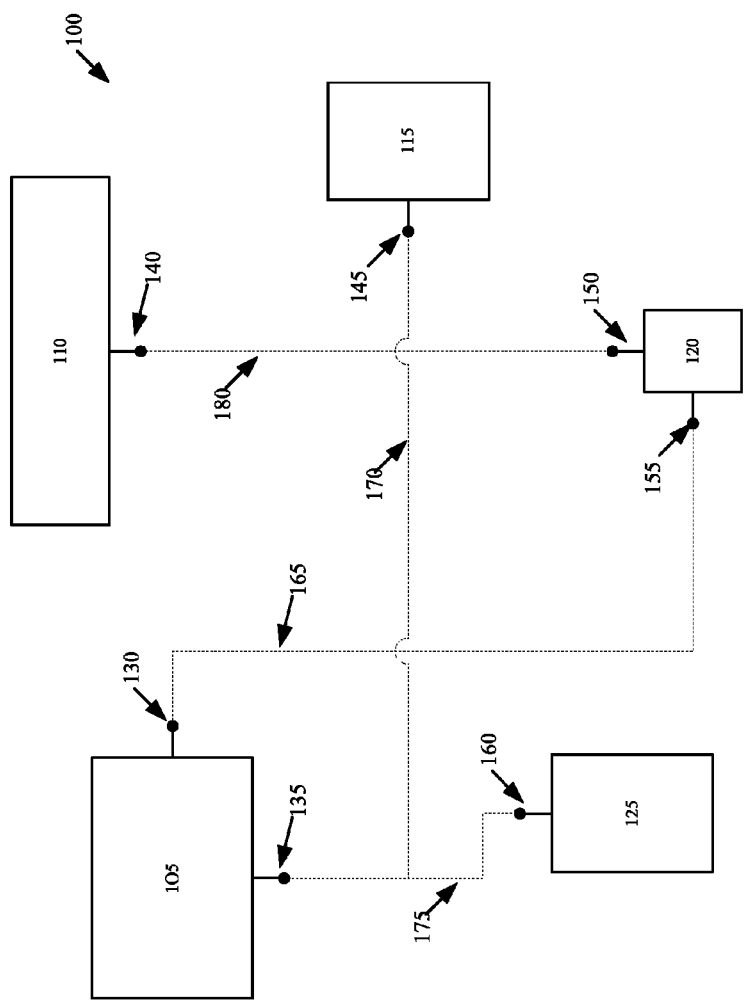
FIG. 1 illustrates an example of an IC layout.
Figure 4:
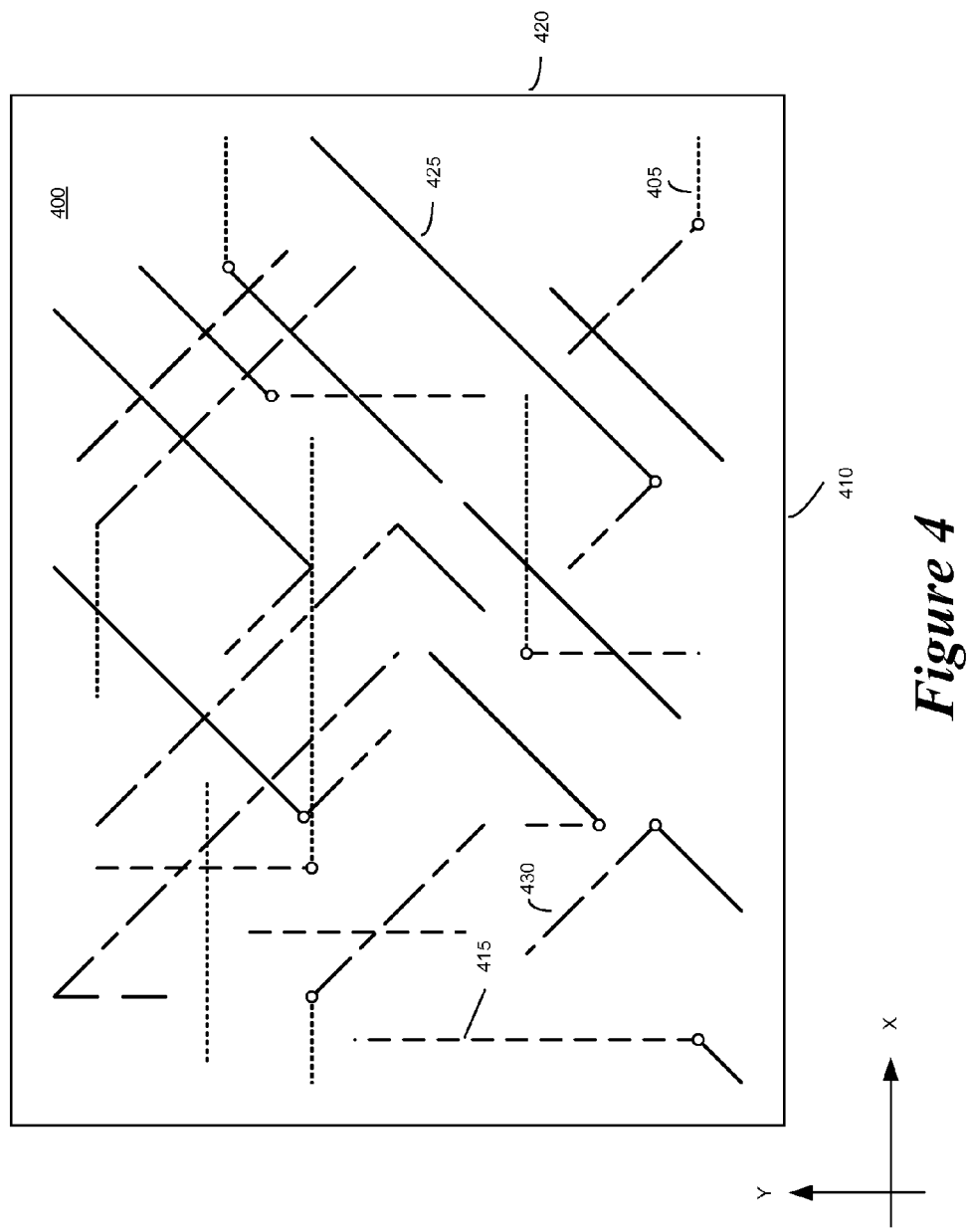
FIG. 4 illustrates the wiring architecture of an IC layout that not only uses diagonal lines, but also uses horizontal and vertical lines.

FIG. 4 illustrates the wiring architecture (i.e., the interconnect-line architecture) of an IC layout 400 that utilizes horizontal, vertical, and 45° diagonal interconnect lines. In this document, this architecture is referred to as the octagonal wiring model, in order to convey that an interconnect line can traverse in eight separate directions from any given point.

The horizontal lines 405 are the lines that are parallel (i.e., are at 0°) to the x-axis, which is defined to be parallel to the width 410 of the layout. The vertical lines 415 are parallel to the y-axis, which is defined to be parallel to the height 420 of the layout. In other words, the vertical interconnect lines 415 are perpendicular (i.e., are at 90°) to the width of the IC layout. In this architecture, one set 425 of diagonal lines are at +45° with respect to the width of the IC layout, while another set 430 are at −45° with respect to the width of the IC layout.

Figure 5:
FIG. 5 illustrates one manner of implementing the wiring architecture illustrated in FIG. 4.

FIG. 5 illustrates one manner of implementing the wiring architecture illustrated in FIG. 4 on an IC. Specifically, FIG. 5 illustrates five metal layers for an IC. The first three layers 505-515 are Manhattan layers. In other words, the preferred direction for the wiring in these layers is either the horizontal direction or the vertical direction. The preferred wiring direction in the first three layers typically alternates so that no two consecutive layers have the same direction wiring. However, in some cases, the wiring in consecutive layers is in the same direction.

The next two layers 520 and 525 are diagonal layers. The preferred direction for the wiring in the diagonal layers is ±45°. Also, as in the first three layers, the wiring directions in the fourth and fifth layer are typically orthogonal (i.e., one layer is +45° and the other is −45°), although they do not have to be.

Even though some embodiments of the invention are described below to work with IC layouts that utilize the above-described octagonal wiring model, one of ordinary skill will understand that the invention can be used with any wiring model. For instance, the invention can be used with wiring architectures that are strictly diagonal (i.e., that do not have horizontal and vertical preferred direction wiring).

Also, some embodiments are used with non −45' diagonal wiring. For example, some embodiments are used with IC layouts that have horizontal, vertical, and ±120° diagonal interconnect lines. In this document, such a wiring architecture is referred to as the hexagonal wiring model, in order to convey that an interconnect line can traverse in six separate directions from any given point.

II. Min-Cut Bipartitoning with Diagonal Lines

A. Diagonal Cut Lines

Some embodiments of the invention are min-cut bipartitioning techniques that utilize diagonal cut lines. As further described below by reference to FIGS. 6-8, some embodiments only utilize diagonal cut lines, while other embodiments use diagonal, horizontal, and vertical cut lines. As will be further described below in Section II.A and B, some embodiments utilize approximations of diagonal cut lines.

The cut lines are used to partition the IC layout recursively into successive pairs of regions. After defining the cut line at each level of the recursion, the invention's min-cut bipartitioning method calculates the number of nets that are intersected by the cut line of the particular level. This number is indicative of the wire congestion about this cut line. Next, at each recursion level, an optimization technique is used to move the circuit modules between the regions at that level, in order to reduce the number of nets intersected by the cut line of that level. The minimization of the net-cut cost at each level of the recursion reduces wire congestion across the cut line at that level.

The invention's min-cut bipartitioning technique can be used with IC layouts that only use the Manhattan wiring model (i.e., IC layouts that only have preferred horizontal and vertical direction wiring). In other instances, the invention's min-cut bipartitioning technique is used with IC layouts that have diagonal interconnect lines. In some of these instances, the diagonal cut lines are in the same direction as some or all of the diagonal interconnect lines. For instance, for IC layouts that use the octagonal wiring model (i.e., that use horizontal, vertical, and 45° diagonal lines), some embodiments use 45° diagonal cut lines.

Figure 6:
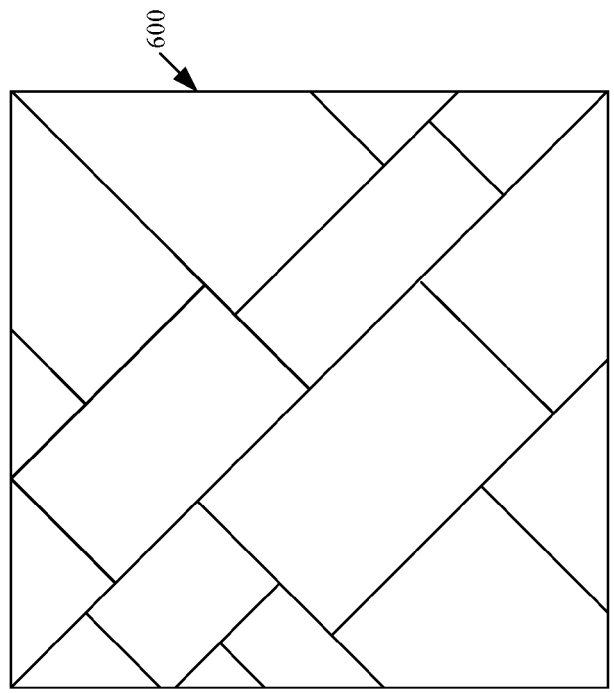
FIG. 6 illustrates an IC layout that has been recursively partitioned into a number of regions by only diagonal cut lines.

FIG. 6 illustrates an IC layout 600 that has been recursively partitioned into a number of regions by only diagonal cut lines. Such a strict diagonal-partitioning approach is typically used when the IC layout uses only diagonal interconnect lines. However, such an approach can be taken when the IC layout uses diagonal and Manhattan interconnect lines.

Figure 7:
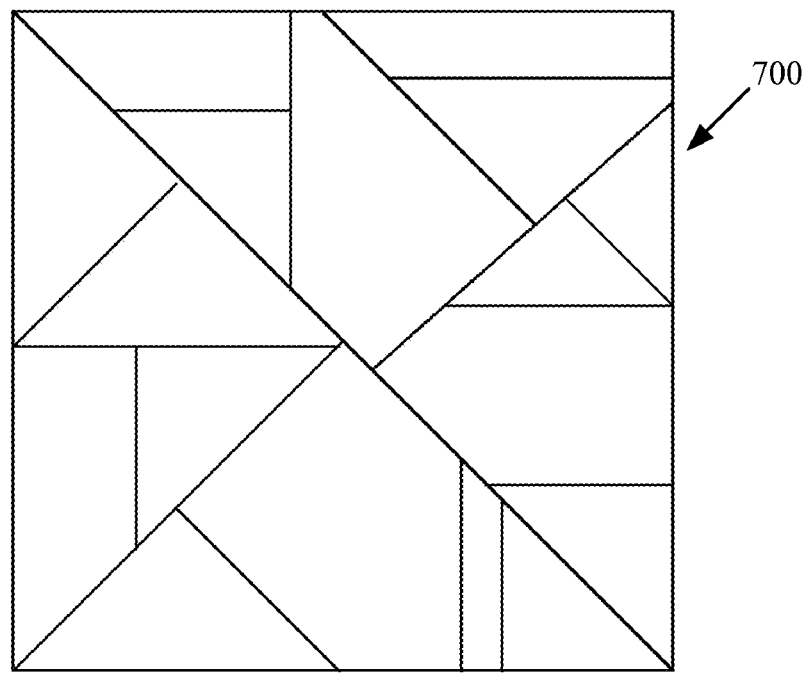
FIGS. 7 and 8 illustrate two IC layouts that are recursively partitioned by combinations of diagonal, horizontal, and vertical cut lines.
Figure 8:
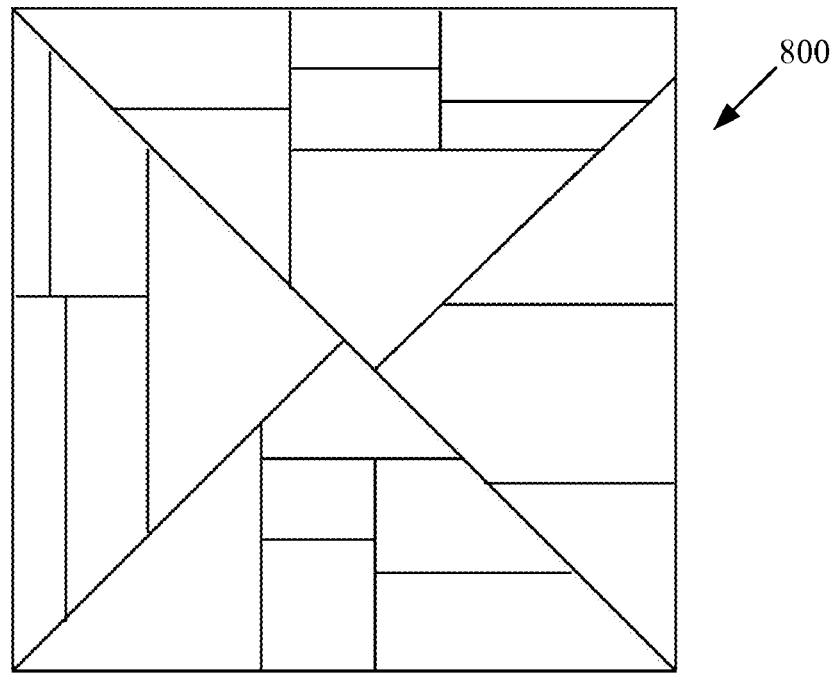

FIGS. 7 and 8 respectively illustrate two IC layouts 700 and 800 that are recursively partitioned by combinations of diagonal, horizontal, and vertical cut lines. In FIG. 7, diagonal cut lines are used at all levels of the recursion. On the other hand, in FIG. 8, the diagonal cut lines are only used at the higher recursion levels, and Manhattan cut lines are used at the lower levels of the recursion.

In other words, the partitioning scheme illustrated in FIG. 8 stops using diagonal cut lines once it reaches some of the lower levels of the recursion process. Such a partitioning scheme (i.e., a scheme that stops using diagonal cut lines at the lower recursion levels) is useful in connection with IC layouts that have their diagonal layers as their top metal layers. Such a partitioning scheme is useful for such layouts because the first set of cut lines reduce the congestion of longer wires, and the longer wires are likely to be diagonal wires. In octagonal wiring models that have the diagonal layers as the top metal layers, the diagonal wires tend to be long, because otherwise it would be wasteful to incur the delay costs associated with the vias necessary for performing the routing on the higher layers.

Figure 9:
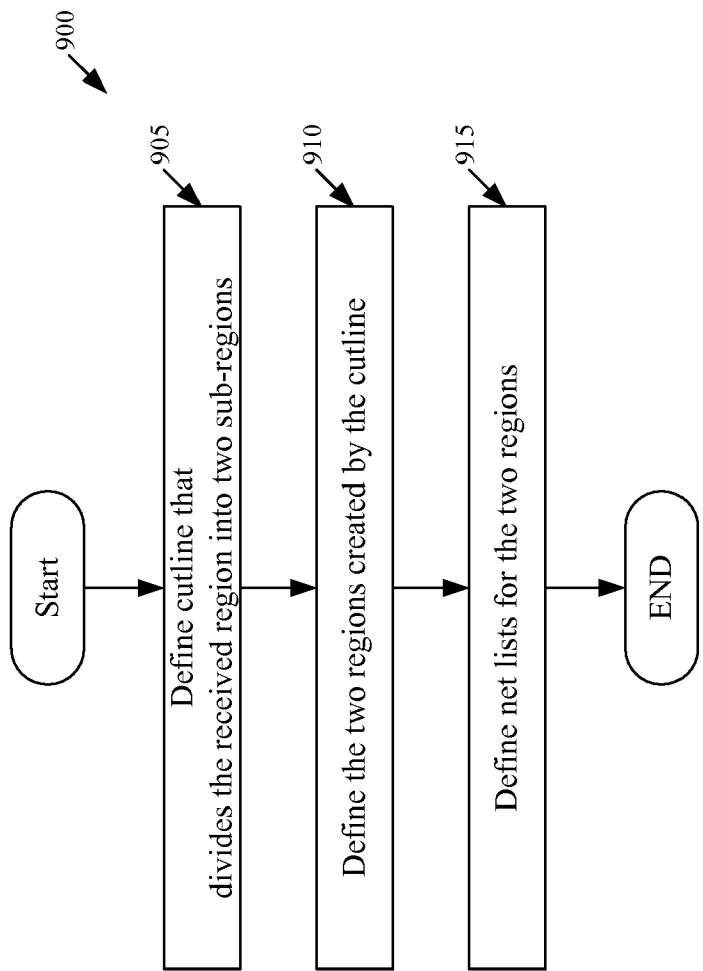
FIG. 9 is a process that defines a cut line that partitions a layout region into two smaller regions.
Figure 10A:
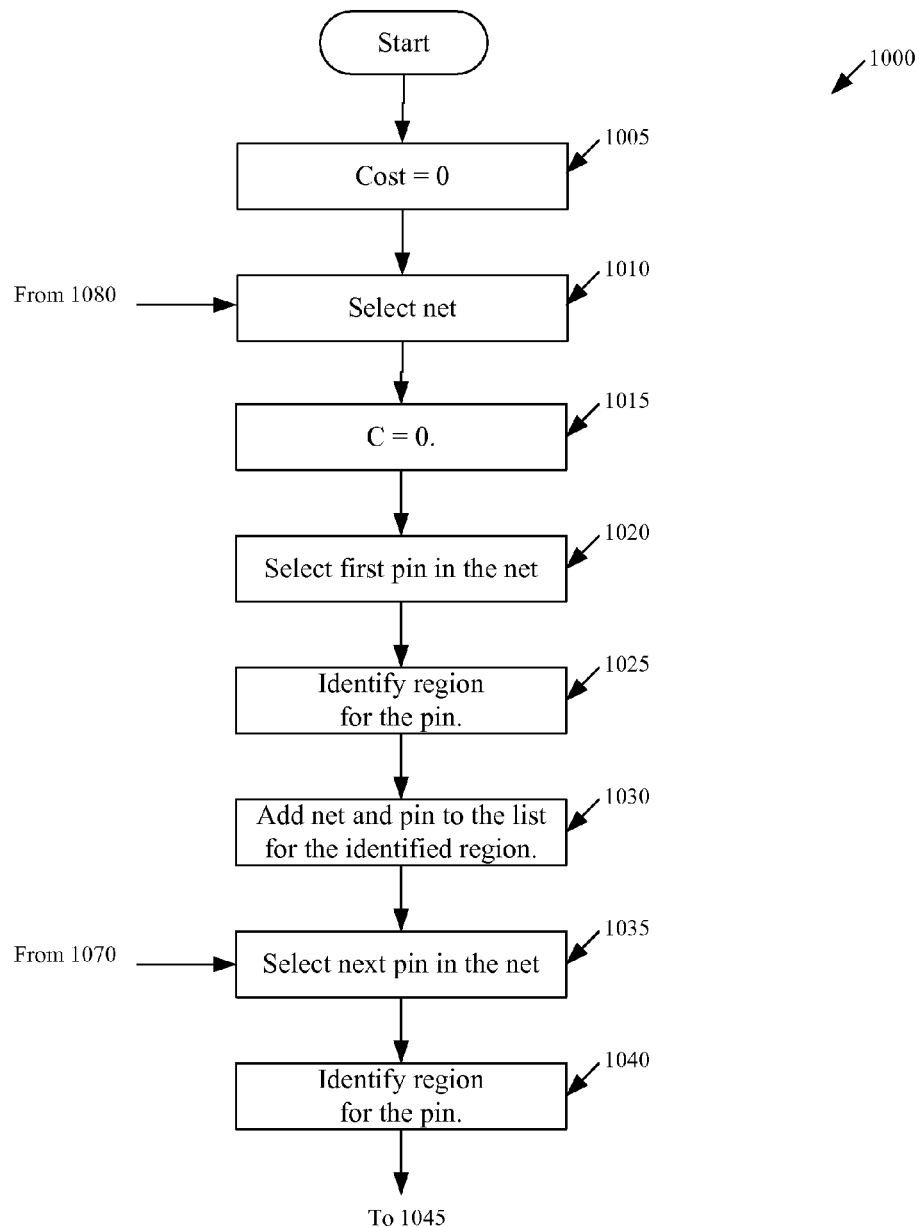
FIG. 10 illustrates a process that generates a congestion cost estimate, and partitions a set of nets, about a cut line.
Figure 10B:
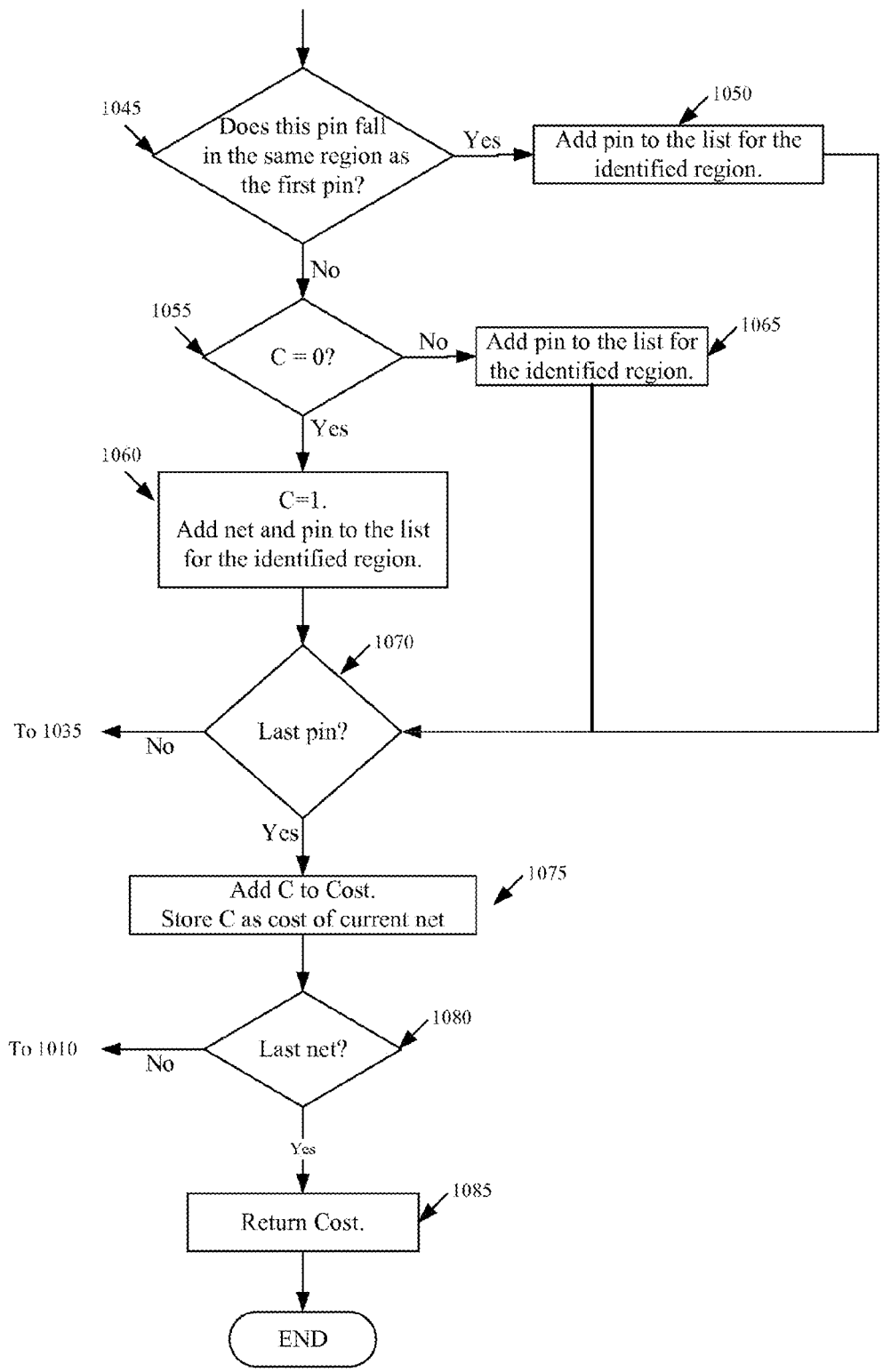

FIGS. 9 and 10 illustrate two processes 900 and 1000 that a placer can use to perform min-cut bipartitioning with diagonal cut lines. The placer can repeatedly use these processes 900 and 1000 to minimize congestion across the IC layout. Specifically, the placer can repeatedly perform the process 900 of FIG. 9 to define a series of cut lines that recursively partition the IC layout into smaller and smaller regions. After defining the cut line at a particular level of the recursion, the placer can then use the process 1000 of FIG. 10 to obtain congestion cost estimates, and to partition nets, across the cut line of that level.

The process 900 starts whenever it receives the coordinates of a region of the IC layout. As shown in FIG. 9, this process initially defines (at 905) a horizontal, vertical, or diagonal cut line that divides the received region into two sub-regions. After defining the cut line, the process 900 defines (at 910) two regions created by the cut line. Some embodiments use the following convention to define the regions: (1) when the cut line is horizontal or diagonal, the first region is above the cut line, while the second region is below the cut line, and (2)

when the cut line is vertical, the first region is to the right of the cut line, and the second region is to the left of the cut line.

Finally, the process 900 initializes (at 915) two net lists for the two regions created by the cut line defined at 905. As further described below, the first time the process 1000 is performed for all the nets in the received region, the process 1000 adds the nets in this received region and the pins of these net to these two net lists. Also, as further described below, the placer and the process 1000 might remove and add nets and pins to these two net lists during the optimization process.

FIG. 10 illustrates a process 1000 that a placer can use to partition a set of nets, and to calculate the congestion cost of these nets, about a cut line that can be diagonal. The process 1000 starts whenever it receives (1) a list of nets, and (2) a cut line for partitioning the nets.

Each net on the received net list has several circuit elements associated with it (i.e., each net is defined to include several circuit elements). In other words, the nets on the net list specify the interconnection between some or all the circuit elements in the IC layout. In the embodiments described below, the circuit elements associated with the nets are the pins of the circuit modules in the IC layout. Other embodiments, however, treat the circuit modules as the circuit elements of the nets. Some of these embodiments treat the circuit modules as the net circuit elements and obviate the need to distinguish between the different pin locations, by assuming that the pins of each module are all located at uniform locations (e.g., located at the origin of the modules).

In some embodiments, an initial placement configuration is defined by the positions of the net circuit elements before the process 1000 is performed for the first cut line. In some of these embodiments, the initial placement configuration is random. In other embodiments, a previous physical-design operation, such as the floor planning, partially or completely specifies the initial placement configuration. Other embodiments use another placer to specify the initial placement configuration, and then use processes 900 and 1000 to optimize the placement configuration for a wiring architecture that uses diagonal wiring.

As shown in FIG. 10, the process 1000 initially sets (at 1005) the congestion cost (Cost) equal to 0. The process then selects (at 1010) a net from the received net list. It then sets (at 1015) a net-cut variable (C) to 0. The process next selects (at 1020) a first pin of the selected net. After selecting the pin, the process determines (at 1025) which of the two regions defined by the cut line contains the pin. When diagonal, horizontal or vertical cut lines are used, the process 1000 identifies the region for the pin by using one of three processes, which are illustrated in FIGS. 11, 12, and 13.

The process 1000 calls the process 1100 of FIG. 11 when the cut line is horizontal. As shown in FIG. 11, the process 1100 determines (at 1105) whether the y-coordinate of the pin is greater than the y-coordinate of the horizontal cut line. If so, the process specifies (at 1110) that the pin is in the first region defined by the cut line. Otherwise, the process specifies (at 1115) that the pin is in the second region defined the cut line.

The process 1000 uses the process 1200 of FIG. 12 when the cut line is vertical. As shown in FIG. 12, the process 1200 determines (at 1205) whether the x-coordinate of the pin is greater than the x-coordinate of the vertical cut line. If so, the process specifies (at 1210) that the pin is in the first region defined by the cut line. Otherwise, the process specifies (at 1215) that the pin is in the second region defined the cut line.

The process 1000 calls the process 1300 of FIG. 13 when the cut line is diagonal. As shown in FIG. 13, the process 1300 inserts (at 1305) the x-coordinate of the pin in the linear equation (y=mx+b) that represents the cut line. This equation expresses the y-coordinate value of the cut line in terms of its slope (m), x-coordinate, and y-intersect (b). The process then determines (1310) whether the y-coordinate of the pin is greater than the derived y-value of the diagonal line at the inserted x-location. If so, the process specifies (at 1315) that the pin is in the first region defined by the cut line. Otherwise, the process specifies (at 1320) that the pin is in the second region defined the cut line.

As will be further described below in Section II.A and B, some embodiments of the invention utilize an approximation of a diagonal cut line to define sub-regions. In instances where such approximations are implemented, the process 1000 may identify the region for the pin by the two processes illustrated in FIGS. 19 and 26. These two processes will also be further described below in Section II.A and B.

After identifying the region for the pin, the process adds (at 1030) the selected net and pin to the net list for the identified region. The process then selects (at 1035) the next pin in the net. At 1040, the process identifies the region for the pin selected at 1035 by calling the same processes described above for 1025.

The process then determines (at 1045) whether the current pin (i.e., the pin selected at 1035) falls in the same region as the first pin. If so, the process adds the current pin to the net previously added (at 1030) to the net list for the identified region. The process then transitions to 1070, which will be described below.

On the other hand, if the process determines (at 1045) that the current pin does not fall in the same region as the first pin, the process determines (at 1055) whether the intersection variable C equals 0. If so, the process realizes that it has detected a net cut. Hence, it changes (at 1060) the value of the intersection variable C to 1, and adds the net and the current pin to the net list for the identified region of the current pin. However, if the process determines (at 1055) that the intersection variable is not 0, the process realizes that it has previously detected the net cut. Therefore, the process simply adds (at 1065) the current pin to the net list for the identified region.

From 1060 and 1065, the process transitions to 1070, where it determines whether it has examined the last pin in the current net. If not, the process transitions back to 1035 to examine the next pin in the net. Otherwise, the process (at 1075) (1) adds the intersection cost C to the congestion cost (Cost), and (2) stores the intersection cost C as the cost of the current net.

Next, the process determines (at 1080) whether it has examined the last net. If not, the process returns to 1010 to (1) select another net, (2) partition this net about the cut line, and (3) determine whether this net crosses the cut line. Otherwise, the process returns (at 1085) (1) the congestion cost of the current placement configuration, and (2) the two net lists that represent the partitioning of the received net list about the received cut line.

As mentioned above, a placer can repeatedly perform the process 900 of FIG. 9 to define a series of cut lines that recursively partition the IC layout into smaller and smaller regions. At each level of the recursion, the placer can then use the process 1000 of FIG. 10 to obtain congestion cost estimate, and to partition nets, across the cut line of that level.

Specifically, for each recursion level, the placer initially supplies the process 1000 with (1) the cut line for that level, and (2) a list of all the nets in that level's region. The process 1000 then (1) partitions the nets in that region about the cut line (i.e., as described above, the process adds the nets and their corresponding pins to the appropriate net lists for the sub-regions created by the cut line), and (2) calculates a cost for the congestion across the cut line.

After receiving from the process 1000 the congestion cost of the initial net configuration within a recursion level's region, the placer then uses an optimization algorithm that iteratively modifies the net configuration within this region to improve the congestion cost generated by the process 1000. In some embodiments, the optimization process uses the process 1000 to calculate the placement-configuration cost for each possible iterative modification to the placement configuration. This is further described below in Section III, which presents several suitable optimization techniques.

B. Staircase Cut Graph as an Approximation of a Diagonal Cut Line

As mentioned above, some embodiment use approximations of diagonal cut lines to implement min-cut bipartitioning. In some embodiments, a staircase cut graph that includes vertical and horizontal cut line segments may be used to approximate such diagonal cut lines. In some embodiments, such approximations may be used by a placer to consider diagonal cut lines.

Figure 14:
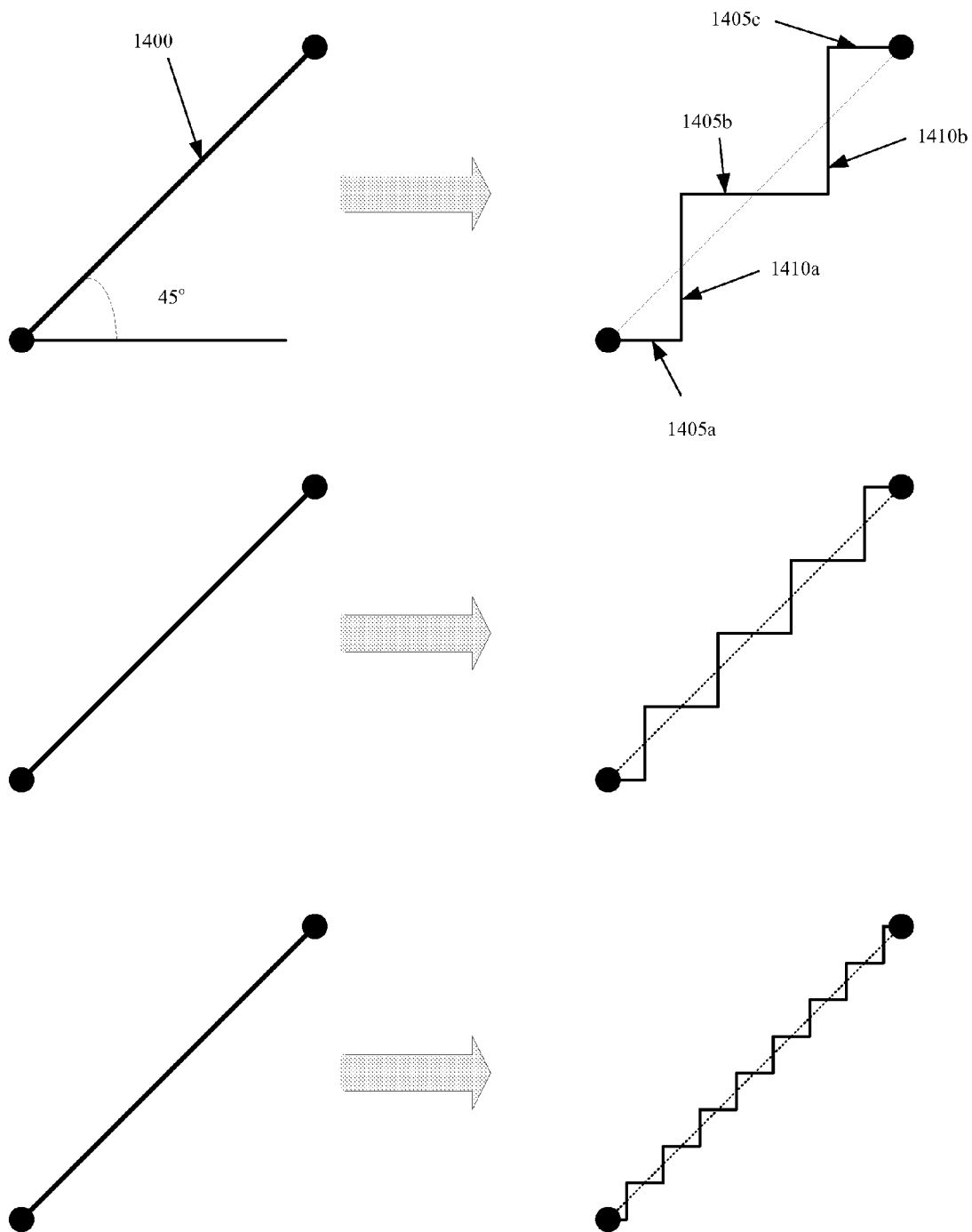
FIG. 14 illustrates implementing a staircase cut graph to approximate a diagonal cut line.

FIG. 14 illustrates how such a staircase cut graph may be used to approximate diagonal cut lines. As shown in this figure, the diagonal cut graph 1400 can be divided into a set of vertical and horizontal cut line segments 1405-1410. As further shown in this figure, different embodiments may use different lengths for the vertical and horizontal cut line segments to approximate a diagonal cut line. FIG. 14 also illustrates that as the length of the vertical and horizontal cut line segments 1405-1410 become shorter relative to the length of the diagonal cut line 1400, the set of vertical and horizontal cut line segments 1405-1410 more accurately approximates the diagonal cut line 1400.

In addition to using different lengths for the vertical and horizontal cut line segments, some embodiments may use different combinations of length for the vertical and horizontal cut line segments. As shown in FIG. 15, the use of different length combinations may be used to approximate diagonal cut lines that are not 45 degree in some embodiments.

Figure 16:
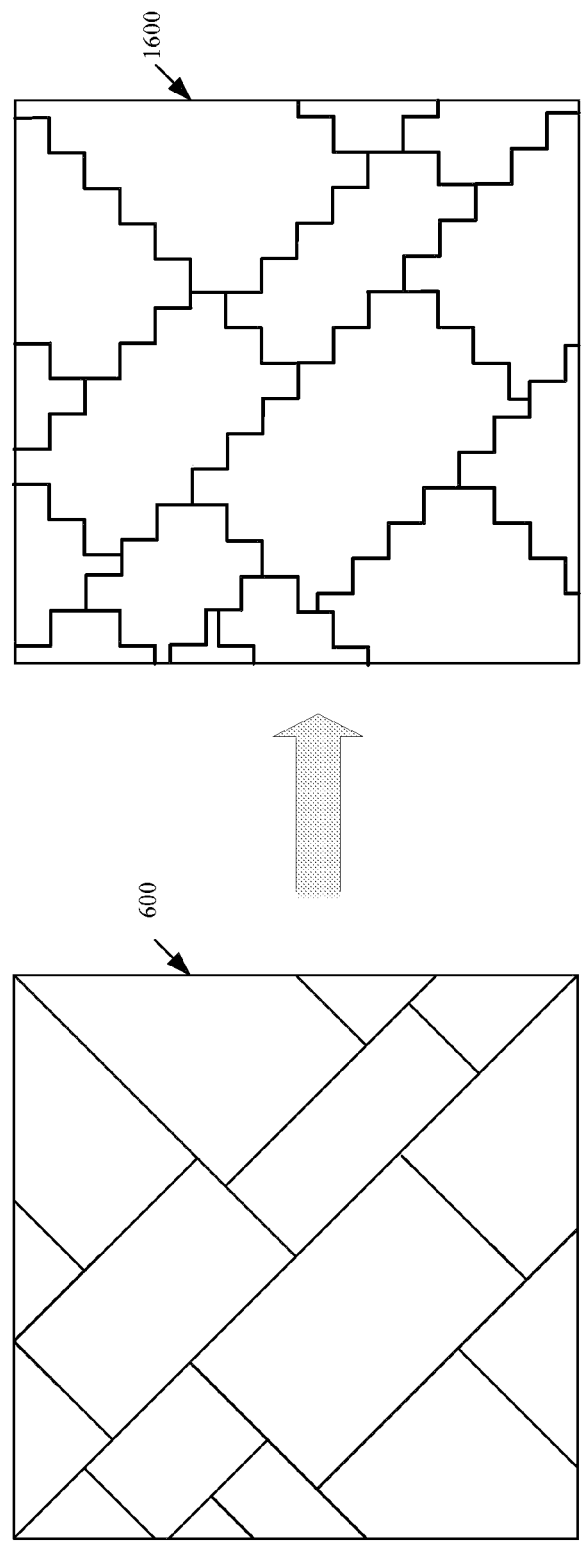
FIG. 16 illustrates implementing staircase cut graphs to emulate partitioning an IC layout using diagonal cut lines.
Figure 17:
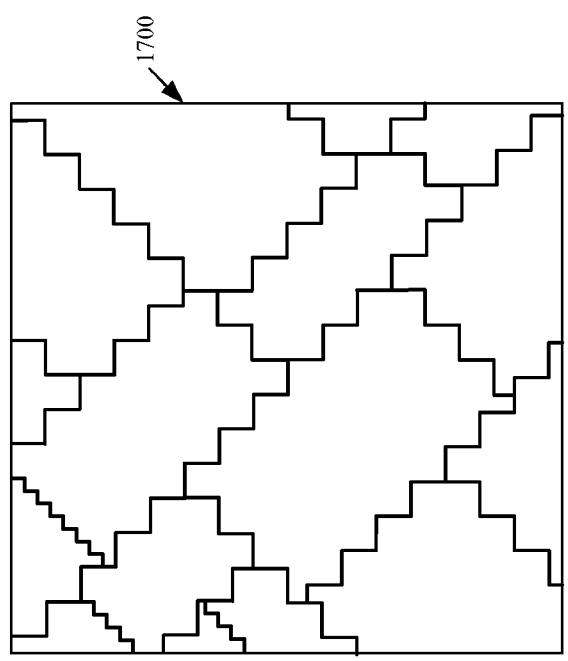
FIG. 17 illustrates implementing staircase cut graphs with various lengths to emulate partitioning an IC layout using diagonal cut lines.

FIG. 16 illustrates an IC layout 1600 that has been recursively partitioned into a number of regions by a staircase cut graph. Specifically, this figure illustrates how the IC layout 600 of FIG. 6, which only used diagonal cut lines, can be similarly produced by only using staircase cut graphs that are approximations of diagonal cut lines. In some embodiments, some of the vertical and horizontal cut line segments of the staircase cut graph have different lengths, as shown in FIG. 17.

Figure 18:
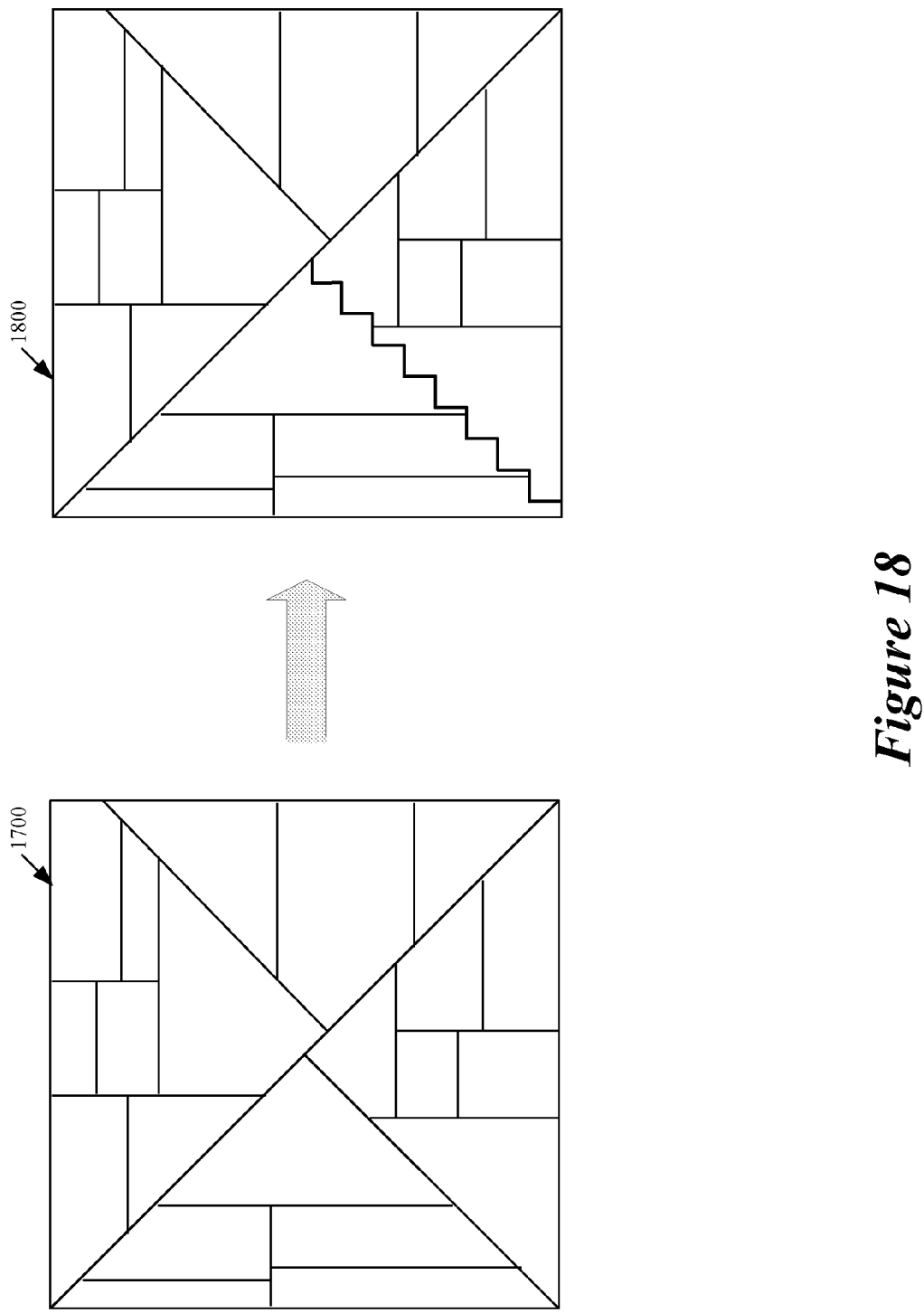
FIG. 18 illustrate an IC layout that is recursively partitioned by combinations of diagonal, horizontal, and vertical and staircase cut graphs.

As previously mentioned above and shown in FIGS. 7 and 8, different embodiments may use diagonal cut lines during some or all of the levels of recursion. Similarly, some embodiments may use approximations of diagonal cut lines during some or all of the levels of recursion. Moreover, approximations of diagonal cut lines may be used in combination with other cut lines. FIG. 18 illustrates an IC layout 1800 that is recursively partitioned by combinations of diagonal, horizontal, vertical and staircase cut graphs. In some embodiments, the use of staircase cut graphs can be used at all levels of the recursion, while the use of staircase cut graphs may only be used for a particular level of the recursion in other embodiments.

Figure 19:
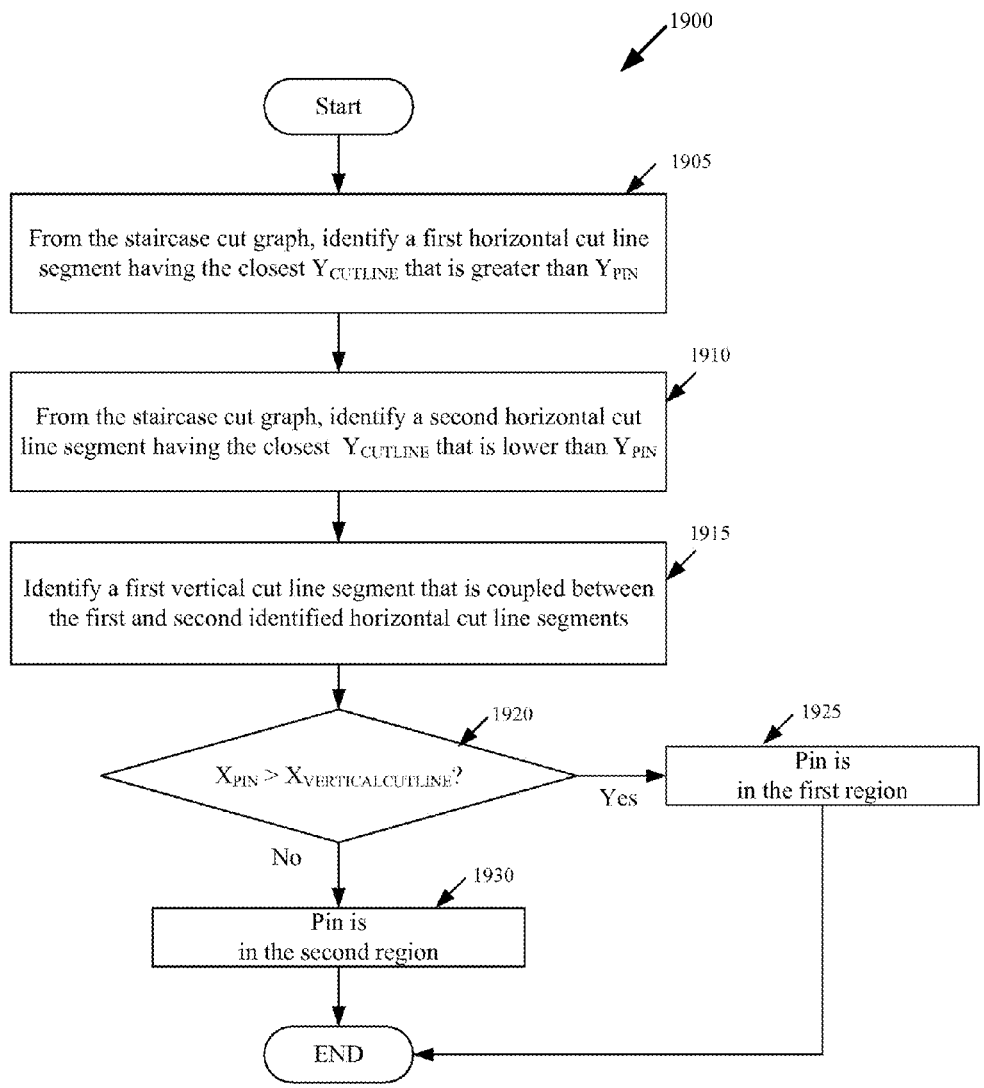
FIG. 19 illustrates a process for identifying a region for a pin.

In some embodiments, the processes of FIGS. 9 and 10 may be used in conjunction with a staircase cut graph. In such instances, the process 1000 calls the process 1900 of FIG. 19 to identify the region for the pin when the current cut graph is a staircase cut graph. As shown in FIG. 19, from the staircase cut graph, the process 1900 identifies (at 1905) a first horizontal cut line segment with the closest y-coordinate that is higher than the y-coordinate of the pin (i.e., horizontal cut line segment with the lowest y-coordinate value greater than y-coordinate value of the pin).

From the staircase cut graph, the process 1900 identifies (at 1910) a second horizontal cut line segment with the closest y-coordinate that is lower than the y-coordinate of the pin (i.e., horizontal cut line segment with the highest y-coordinate value that is less than the y-coordinate value of the pin).

The process then identifies (at 1915) a vertical cut line segment from the staircase cut graph that is coupled between the two identified horizontal cut line segments (at 1905 and 1910). The process 1900 determines (at 1920) whether the x-coordinate of the pin is greater than the x-coordinate of the identified vertical cut line segment. If so, the process specifies (at 1925) that the pin is in the first region defined and ends. Otherwise, the process specifies (at 1930) that the pin is in the second region and ends.

Figure 20:
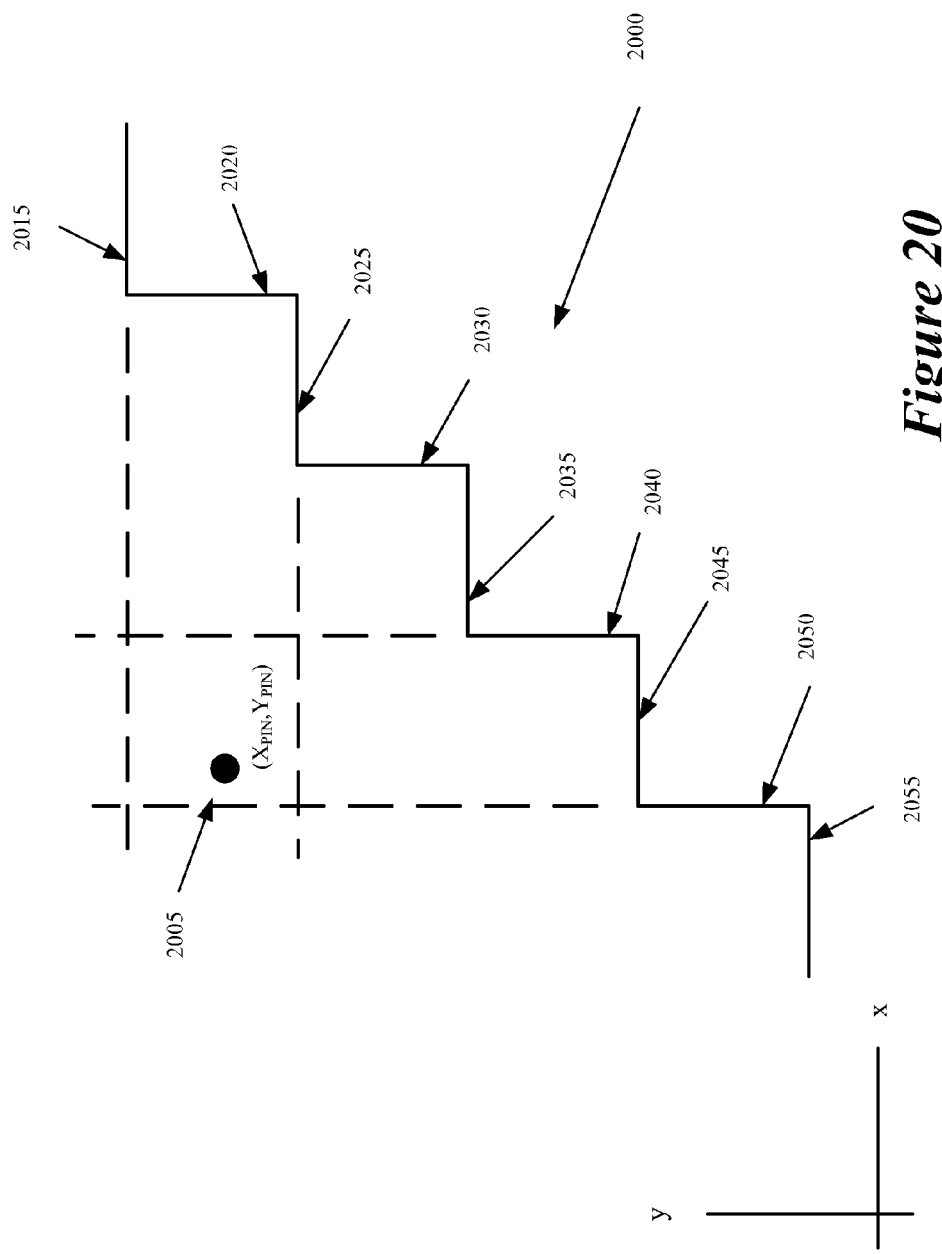
FIG. 20 illustrates a staircase cut graph configuration and pin.

Thus, with reference to the staircase cut graph 2000 and pin 2005 shown in FIG. 20, the process identifies (at 1905) the horizontal cut line segment 2015. The process then identifies (at 1910) the horizontal cut line segment 2025. Based on these two identified cut line segments, the process identifies (at 1915) the vertical cut line segment 2020. Next, the process determines whether the x-coordinate of the pin 2005 is greater than the x-coordinate of the vertical cut line segment 2020. In this particular example, it is not. Therefore, the process specifies (at 1930) that the pin 2005 is in the second region.

Additionally, some embodiments may first identify two vertical cut line segments (e.g., 2040 and 2050) and based on these two vertical cut line segments, identify a horizontal cut line segment (e.g., 2045) coupled between the two identified vertical cut lines segments. The process then determines whether the y-coordinate of the pin (e.g., pin 2005) is greater than the y-coordinate of the identified horizontal cut line segment (e.g., cut line segment 2045). If so, the pin is specified to be in the first region. If not, the pin is specified to be in the second region.

Figure 21:
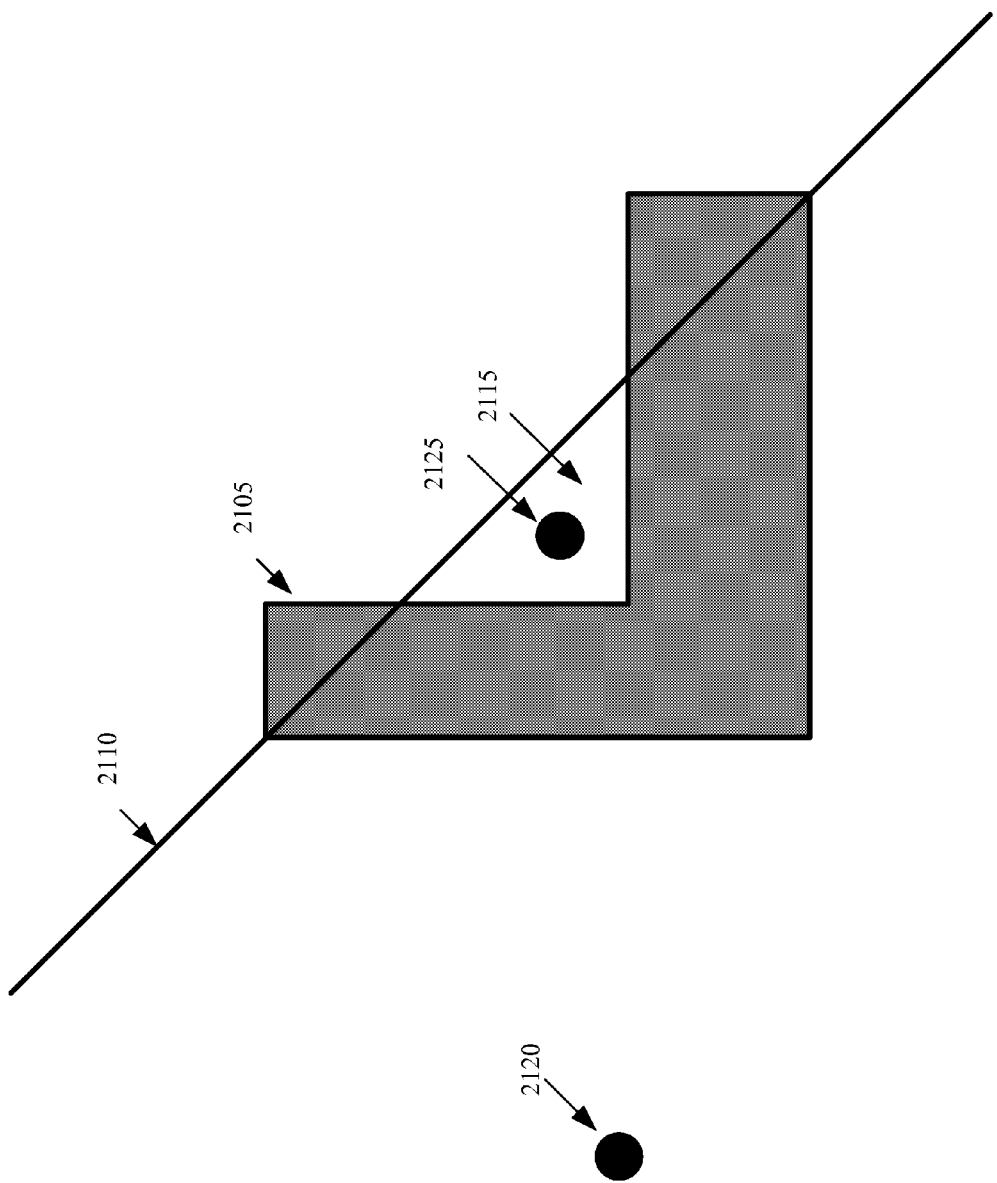
FIG. 21 illustrates an example where staircase cut graphs provides an advantage over a diagonal cut line.

One advantage of using staircase cut graphs is that they are more accurate in determining on which side a pin is located on in certain circumstances. FIG. 21 illustrates an example where staircase cut graphs provides such an advantage. As shown in this figure, the IC layout 2100 includes an L block 2105 that is fixed (i.e., cannot be moved). As further shown in this figure, a diagonal cut line 2110 partitions the IC layout 2100 such that the diagonal cut line 2110 goes through the L block 2105. This partitioning process creates a region 2115 (triangular region defined by the cut line 2110 and the interior corner of the L block 2105) where the partitioning process would compute the region 2115 to be on the left side of the cut line 2110. However, because the region 2115 is surrounded by the L block 2105, any routing from a pin (e.g., pin 2120) on the left side of the diagonal cut line 2110 to a pin (e.g., 2125) in the region 2115 would entail going through the right side of the diagonal cut line 2110.

Figure 22:
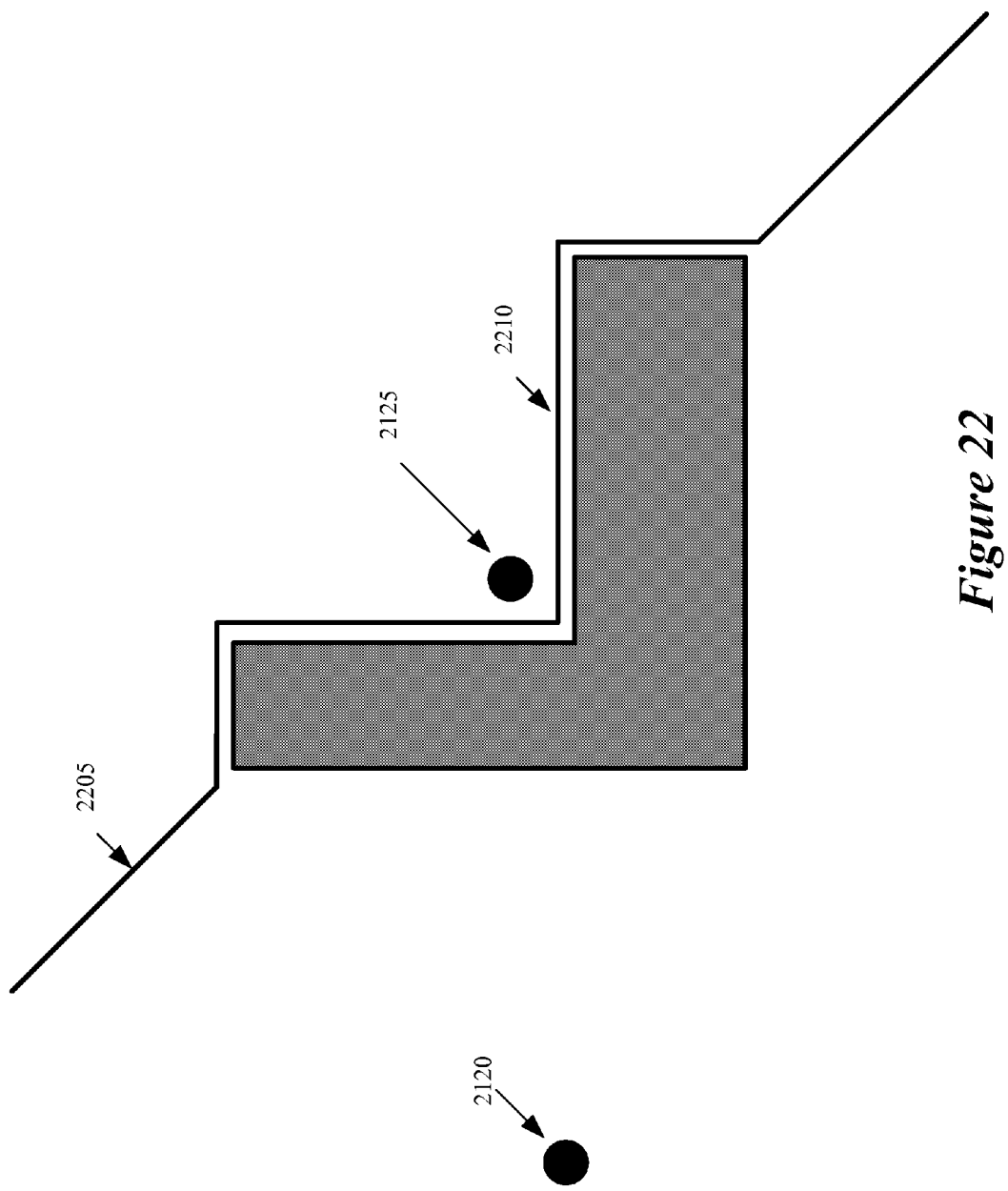
FIG. 22 illustrates the use of combination of a staircase cut graph and a diagonal cut line.

As illustrated in FIG. 22, a combination of a diagonal cut line 2205 and a staircase cut graph 2210 may be used to partition an IC layout to partition around the L block 2105 in some embodiments. When such a combination is used, the regions around an L block can be properly computed to be on the correct side of a cut line or cut graph. For example, pin 2125 can be properly computed to be on the right side of the diagonal cut line 2205 and staircase cut graph 2210.

C. Cut Arc as an Approximation of a Diagonal Cut Line

Some embodiments of the invention may use other cut graphs to approximate diagonal cut lines. For example, some embodiments use cut arcs. An arc is defined as a segment along the circumference of a circle.

Figure 23:
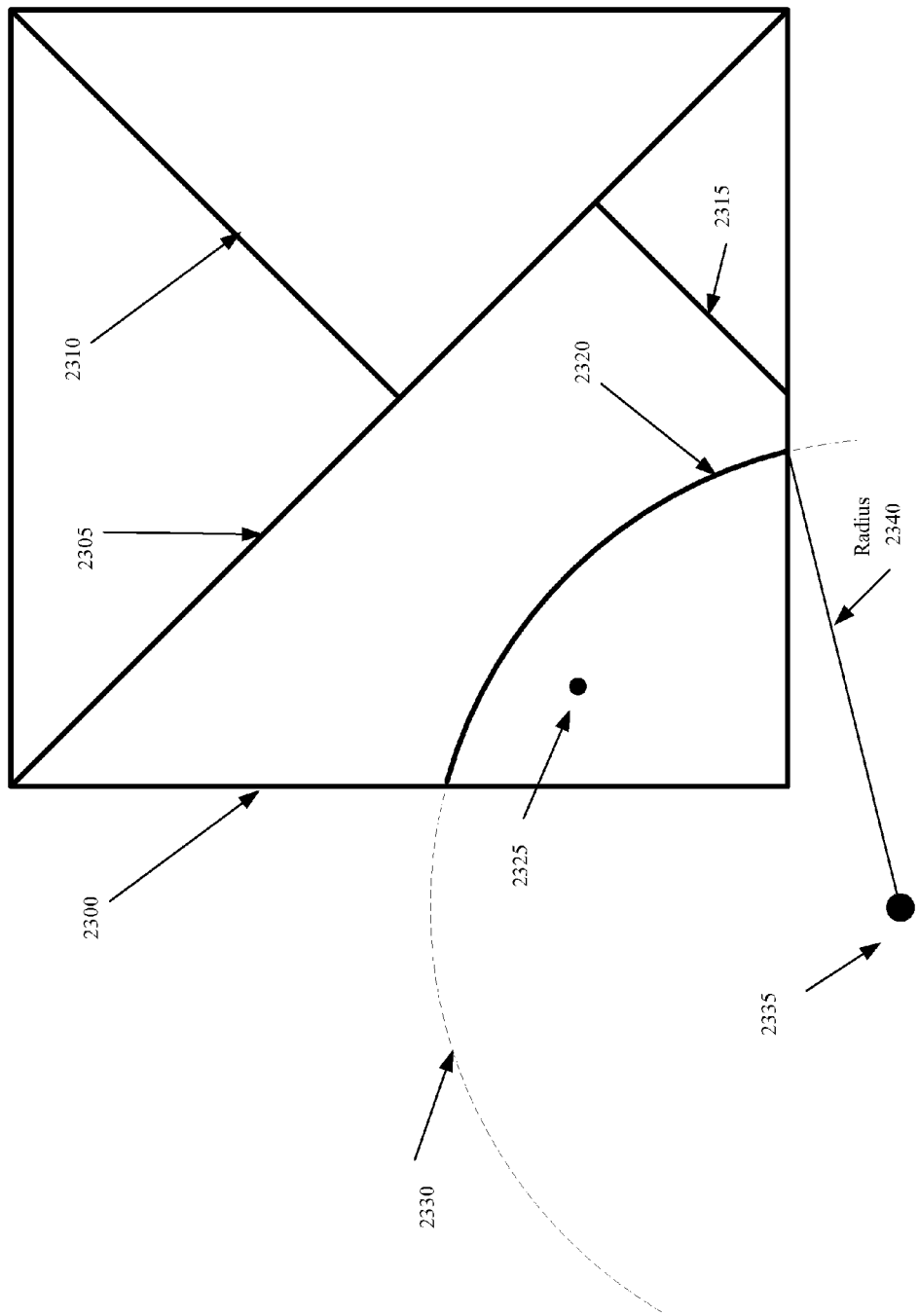
FIG. 23 illustrates implementing a cut arc in for partitioning an IC layout.

FIG. 23 illustrates how a cut arc can be used to approximate a diagonal cut line. Specifically, this figure illustrates how a cut arc may be implemented in a min cut bipartitioning process to emulate a min cut bipartitioning process that uses diagonal cut lines.

As shown in this figure, the IC layout 2300 includes diagonal cut lines 2305-2315, cut arc 2320, and pin 2325. As further shown in this figure, the cut arc 2320 is defined by the circle 2330 (only partial circle is shown) having a center 2335 and a radius 2340.

Figure 24:
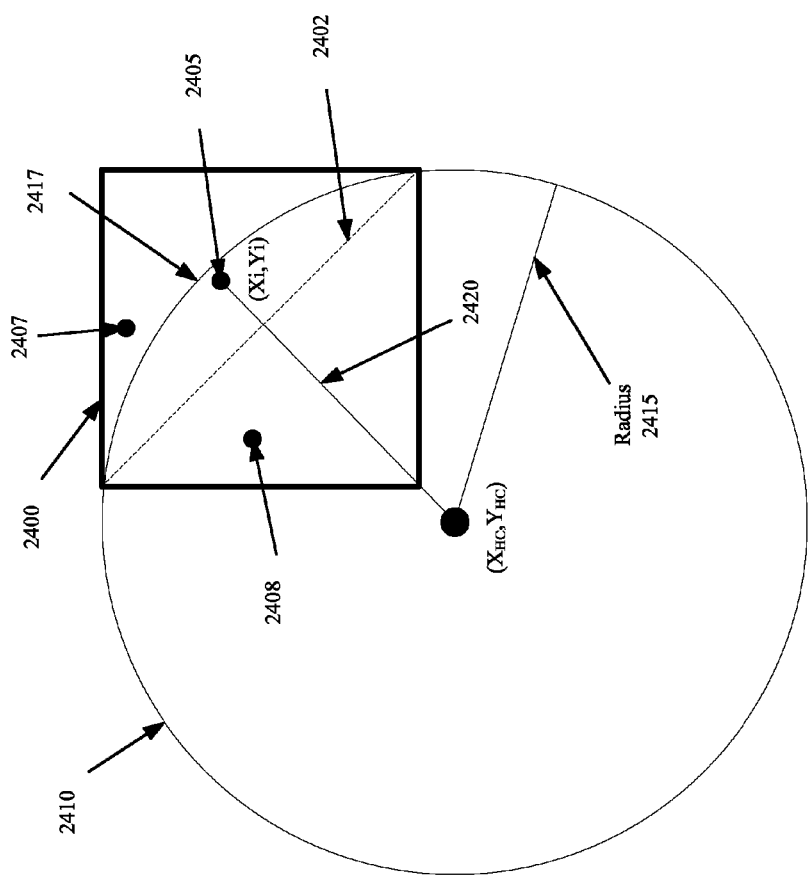
FIG. 24 illustrates using a cut arc to implement a diagonal cut line for partitioning an IC layout.
Figure 25:
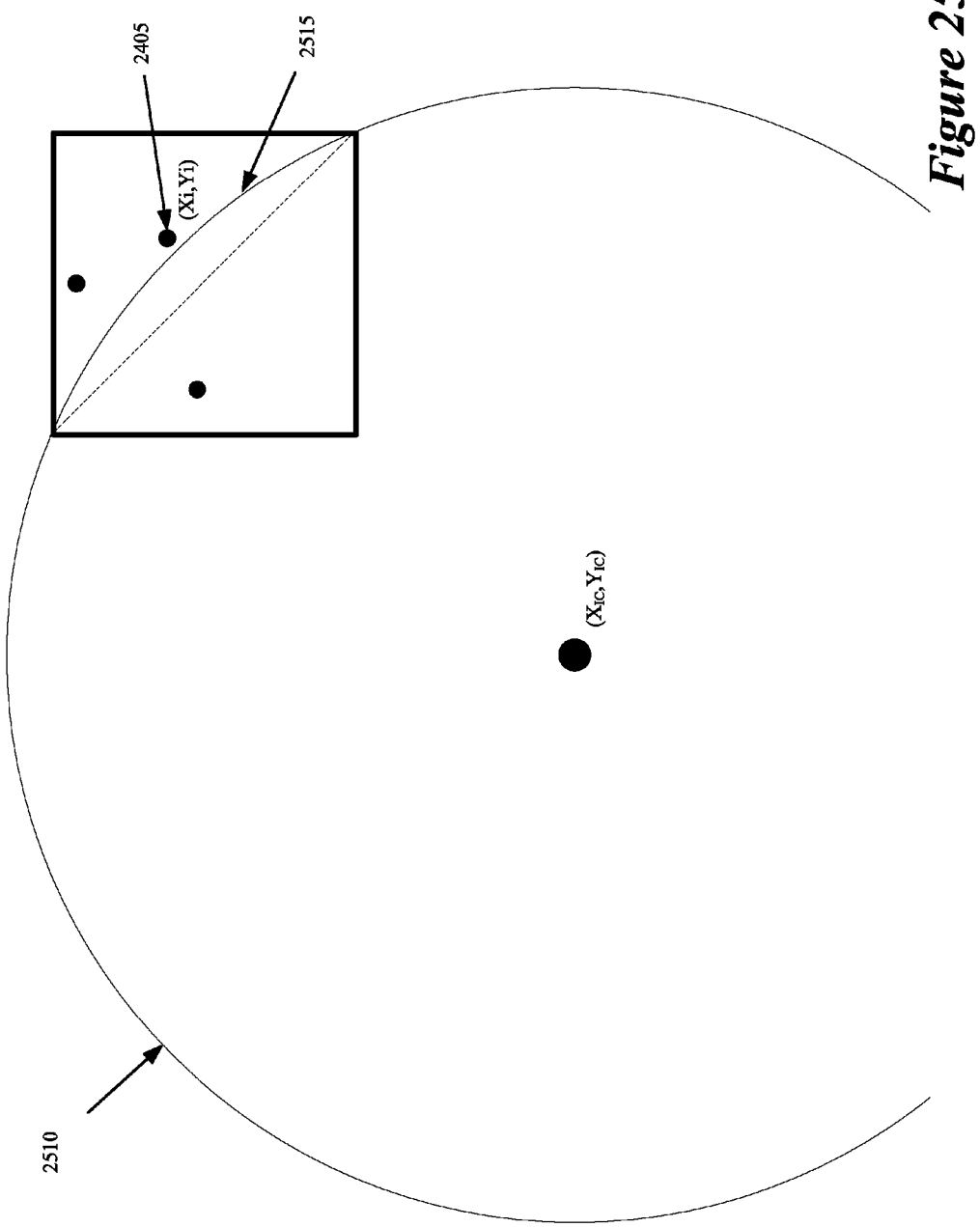
FIG. 25 illustrates another cut arc to implement a diagonal cut line for partitioning an IC layout.

Different embodiments may use different sized cut arcs. FIGS. 24 and 25 illustrate two different size cut arcs are implemented on the same IC layout 2400. As shown in FIG. 24, the IC layout 2400 includes a diagonal cut line 2402, pins 2405, 2407 and 2408. This figure further illustrates that pins 2405 and 2407 are above the diagonal cut line 2402. Therefore, these pins 2405 and 2407 are in the first region. On the other hand, the pin 2408 is below the diagonal cut line 2402 and therefore is in the second region.

As further shown in FIG. 24, if the cut arc 2417 is used for partitioning the IC layout (instead of using the diagonal cut line 2402), pin 2407 would be in the first region (region outside the radius of the circle) and pins 2405 and 2408 would be in the second region (region inside the radius of the circle). This result is different than what was specified using the diagonal cut line 2402. To achieve results that are more accurate (or in line with the diagonal cut line 2402), a circle with a larger radius may be used. This is because as the radius of circle increases, the arc of circle becomes more like a diagonal line. FIG. 25 illustrates the use of such a larger circle 2510 (partial circle shown). As shown in this figure, the cut arc 2505 is a closer approximation of the diagonal line 2402 than the cut arc 2405. Moreover, when a process uses this cut arc 2505, the pin 2405 and 2407 are in the first region, whereas the pin 2408 is in the second region. This result is the same as one achieved using the diagonal cut line 2402. As such, a cut arc may be used to accurately approximate a diagonal cut line if the radius of the circle that defines the cut arc is sufficiently large.

Figure 26:
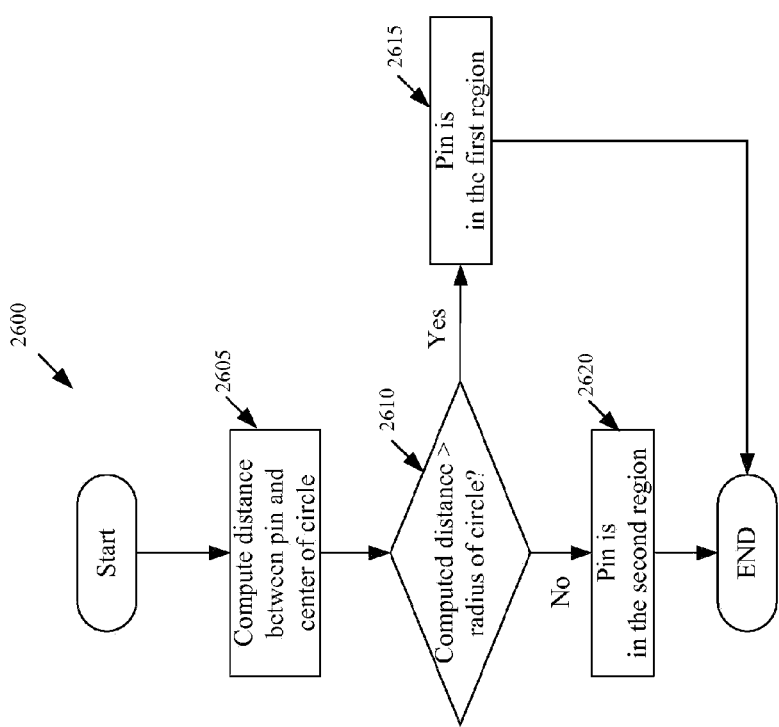
FIG. 26 illustrates another process for identifying a region for a pin.

In instances when a cut arc is used for partitioning an IC layout, some embodiments, use the process 2600 of FIG. 26 to identify the region for the pin. Accordingly, when the processes of FIGS. 9 and 10 use a cut arc to partition an IC layout, the process 1000 may call the process 2600 to identify the region for the pin.

As shown in FIG. 26, the process 2600 computes (2605) a distance between the particular pin the IC layout and the center of the circle that defines the cut arc. Some embodiments use Equation (F) to determine such a distance ("Dp").

$$D_P = \sqrt{[(X_i - X_{HC})^2 + (Y_i - Y_{HC})^2]}$$ Equation (F)

where Xi and Yi are the coordinates of the pin and, $X_{HC}$ and $Y_{HC}$ are the coordinates of the center of the circle that defines the cut arc. The process determines (at 2610) whether the distance ("Dp") between the pin and the center of the circle is greater than the radius of the circle. Thus, in reference to the IC layout shown in FIG. 24, the process determines (at 2610) whether the distance 2420 between the center of the circle 2410 and pin 2405 is greater than the radius 2415 of the circle 2410. If the distance ("Dp") is greater than the radius 2415, the process specifies (at 2615) that the pin is in the first region defined by the cut arc and ends. Otherwise, the process specifies (at 2620) that the pin 2405 is in the second region defined by the cut arc and ends.

III. Optimization Techniques

As mentioned above, the invention's cost-calculating methods can be used with a variety of optimization techniques. Three suitable optimization techniques are described below. These three are: (1) local optimization, (2) simulated annealing, and (3) KLFM.

A. Local Optimization

Local optimization is a technique that iteratively modifies the placement configuration to improve the placement score generated by a cost-calculating function. At each iteration, this technique might move one circuit module, swap two modules, or move a number of related modules, etc. Also, at each iteration, this technique randomly selects moves. In addition, this technique does not accept moves that make the calculated cost worse.

Figure 27A:
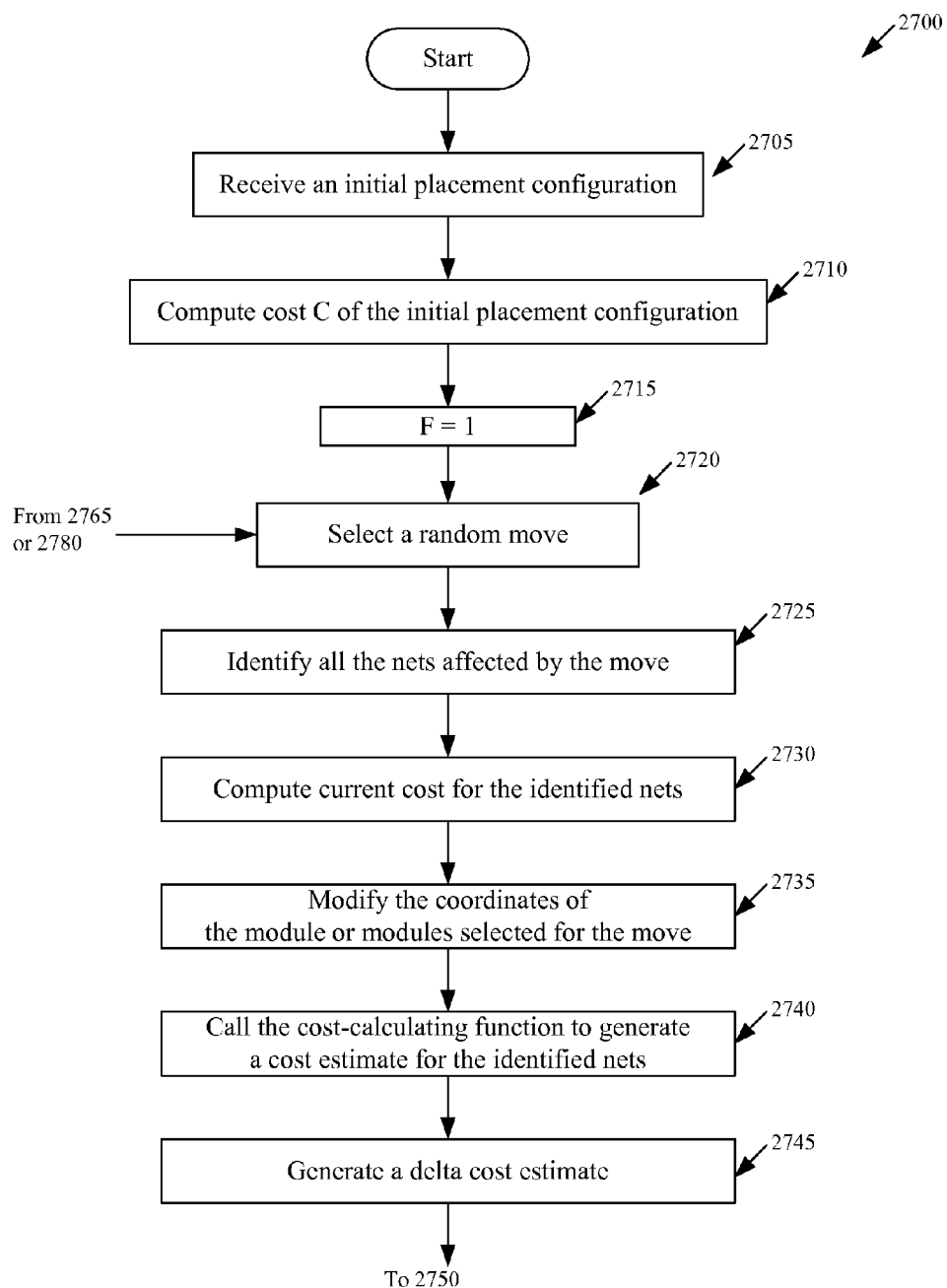
FIG. 27 illustrates one example of a local optimization process.
Figure 27B:
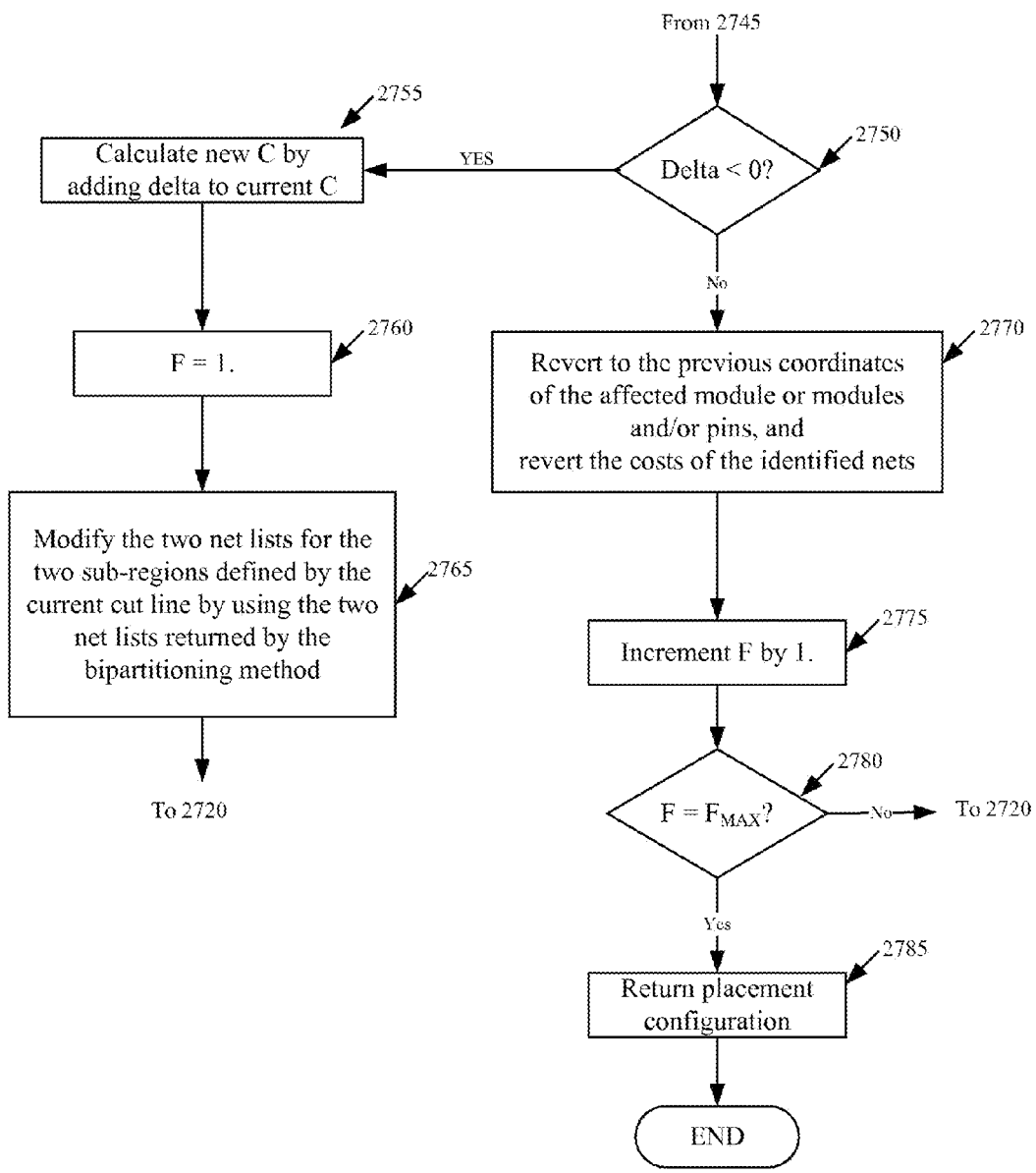

FIG. 27 illustrates one example of a local optimization process 2700. This process initially receives (at 2705) an initial placement configuration. In some embodiments, the process receives the initial configuration by receiving a list of circuit modules, a starting placement configuration for these modules, and a net list that specifies the interconnection between these modules.

After receiving the initial placement configuration, the process 2700 calls (at 2710) a cost-calculating method, like one of the cost-calculating methods described above in Section II. In response, this cost-calculating method computes and returns the cost (C) of the initial placement configuration.

When the process 2700 calls the cost-calculating method, it supplies this method with a net list that specifies the initial placement configuration (i.e., a net list that identifies all the nets in the IC layout before any modifications to the positions of the modules in the layout).

Also, when the cost-calculating method is the bipartitioning process 1000 described above, the process 2700 calls the process 900 before calling the process 1000. As described above, the process 900 defines a cut line for the current IC region being optimized by the optimization process 2700. The process 2700 supplies the congestion-calculating process 1000 with this cut line along with the initial-configuration's net list, in order to receive from the process 1000 the net-cut congestion cost (C) of the initial placement configuration. From the process 1000, the process 2700 also receives two net lists that specify the nets and the pins in the two regions defined by the current cut line.

After obtaining cost of the initial placement configuration at 2710, the process sets (at 2715) a futile-iteration counter (F) equal to 1. As further described below, the process uses counter to determine whether it needs to terminate its operation as it has performed a predetermined number of iterations without improving the score.

The process then selects (at 2720) a random move that requires the modification of the coordinates of one or more circuit modules in the IC layout. The process next identifies (at 2725) all the nets affected by this random move. Depending on how nets are defined, these nets are the nets that either (1) contain the circuit module or modules selected for the move, or (2) contain the pins of these circuit modules.

At 2730, the process computes the current cost for the nets identified at 2725. As mentioned above, the cost calculating process 1000 stores the cost for each net. Hence, the process 2700 can compute the current cost for the identified nets by summing the stored cost values for these nets.

According to the selected random move, the process 2700 modifies (at 2735) the coordinates of each circuit module and/or pin affected by the move. In other words, at 2735, the process makes the move by modifying the coordinates of the affected circuit module or modules and/or their associated pins to match the random location identified at 2720.

The process then calls the cost-calculating process and supplies this process with a net list that specifies the identified nets that are affected by the selected move. This net list specifies the configuration of the identified nets after the selected move, since the process 2700 modified the coordinates of the affected circuit modules and/or pins at 2735. In the embodiments where the cost-calculating process is the bipartitioning process 1000, the process 2700 supplies this process 1000 with the cut line for the current IC region being optimized, along with the list of the identified nets.

In response to the call at 2740, the cost-calculating method computes and returns the cost (C) for the configuration of the identified nets after the potential modification. When the cost-calculating method is the bipartitioning process 1000, this process also partitions the identified nets about the cut line, and returns two net lists that reflect this partitioning.

After receiving (at 2740) the cost for the identified nets after the potential modification, the process generates (at 2745) a delta cost by subtracting the cost for the identified nets after the potential modification (i.e., the cost calculated at 2740) from the cost for the identified nets before the potential modification (i.e., the cost calculated at 2730)

At 2750, the process determines whether the delta cost is less than zero. If so, the selected move reduces the placement cost, and the process decides to retain the move. Specifically, when the delta cost is less than zero, the process sets (at 2755) the cost of the current placement configuration (i.e., the placement configuration with the selected move) equal to the cost of the previous placement configuration (i.e., the placement configuration without the selected move) plus the delta cost. The delta cost is negative and thereby reduces the overall placement configuration cost C.

The process 2700 then resets (at 2760) the futile-iteration counter F to 1. The process 2700 uses (at 2765) the two net lists returned by the method 1000 at 2740 to modify the two net lists for the two sub-regions defined by the current cut line. The process then returns to 2720 to select another random move.

If the process determines (at 2750) that the delta cost is not less than zero, the process realizes that the selected move does not reduce the placement cost. Consequently, the process changes (at 2770) the coordinates of the affected circuit module or modules and/or their corresponding pins back to their original coordinates before the move (i.e., their coordinates before 2735). The process also changes the cost of each of the identified nets back to its original value (i.e., back to the cost stored for the net before 2740).

The process then increments (at 2775) the futile-iteration counter by one. The process then determines (at 2780) whether the futile-iteration count equals a pre-specified maximum. If not, the process returns to 2720 to select another random move. Otherwise, the process realizes (at 2780) that it has performed a pre-specified maximum number of iterations without improving the placement score. Hence, the process returns (at 2785) a net list specifying the current placement configuration, and then ends.

B. Simulated Annealing

Simulated annealing is an optimization technique that iteratively modifies the placement configuration to improve the placement score generated by a cost-calculating function. At each iteration, this technique might move one circuit module, swap two modules, move a number of related modules, etc. Also, at each iteration, this technique randomly selects moves. It also accepts moves that make the calculated cost worse, but it tolerates fewer bad moves as the number of iterations increases.

Figure 28A:
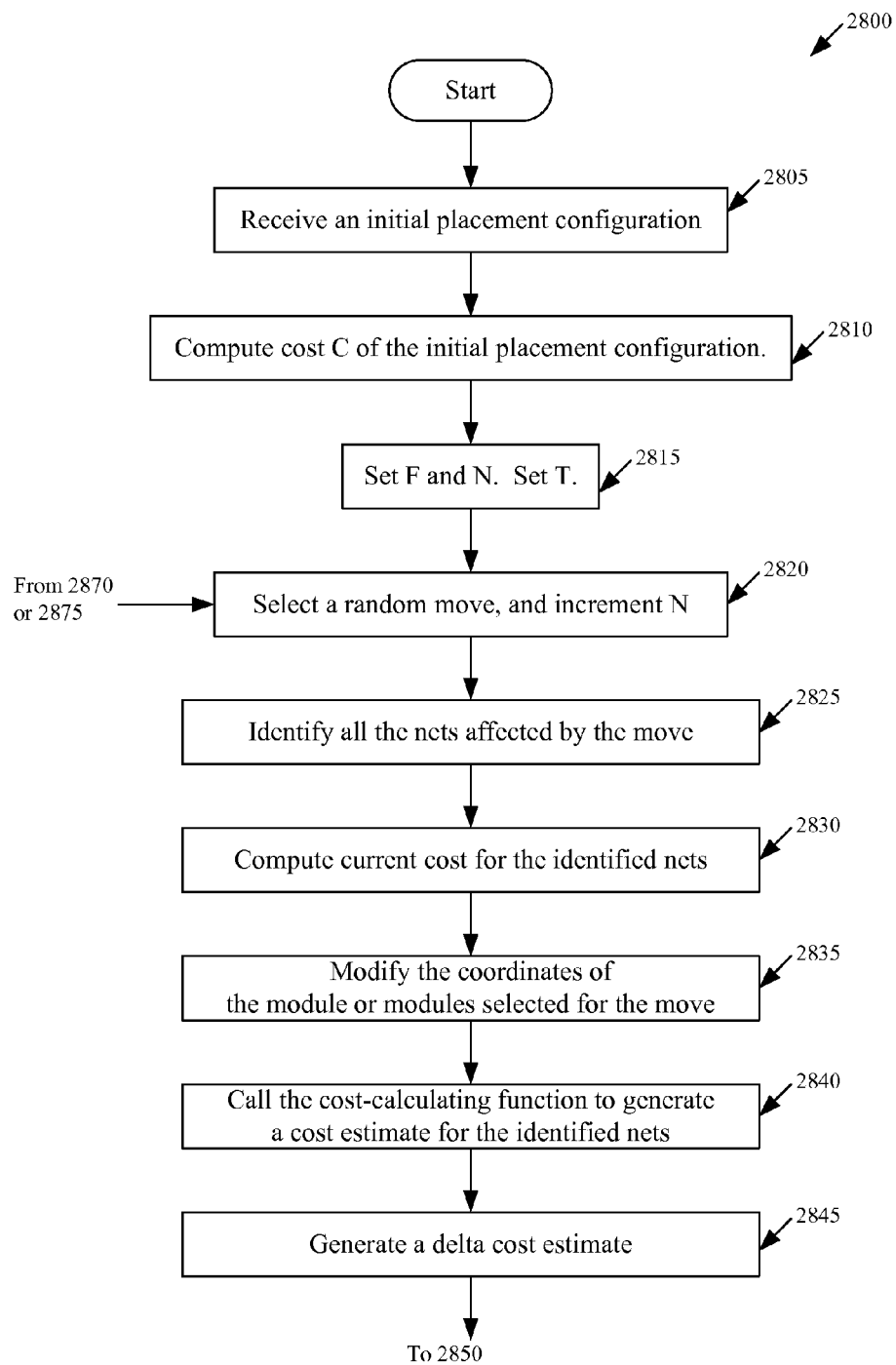
FIG. 28 illustrates one example of a simulated annealing process.
Figure 28B:
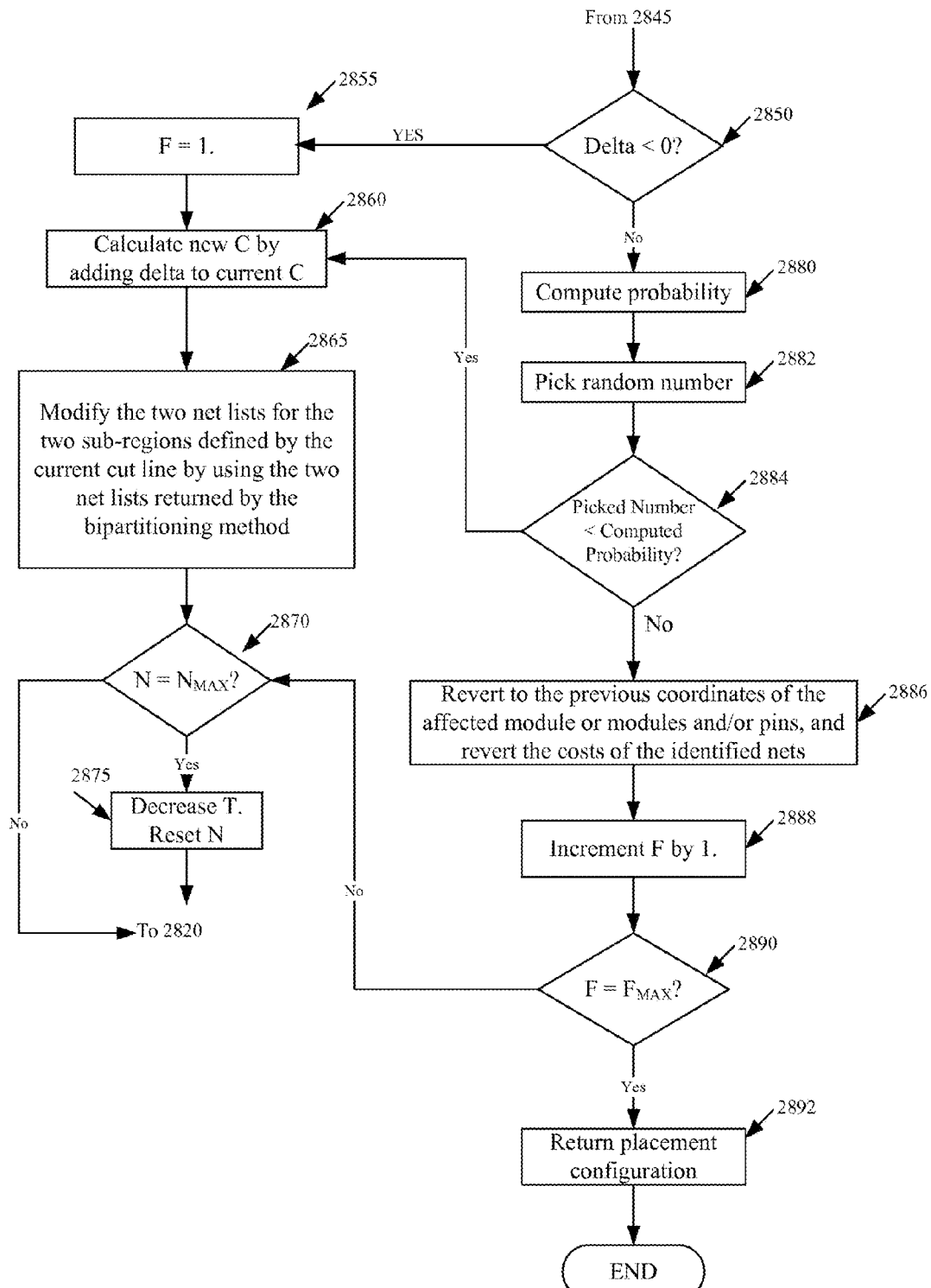

FIG. 28 illustrates one example of a local optimization process 2800. This process initially receives (at 2805) an initial placement configuration. In some embodiments, the process receives the initial configuration by receiving a list of circuit modules, a starting placement configuration for these modules, and a net list that specifies the interconnection between these modules.

After receiving the initial placement configuration, the process 2800 calls (at 2810) a cost-calculating method, like one of the cost-calculating methods described above in Section II. In response, this cost-calculating method computes and returns the cost (C) of the initial placement configuration.

When the process 2800 calls the cost-calculating method, it supplies this method with a net list that specifies the initial placement configuration (i.e., a net list that identifies all the nets in the IC layout before any modifications to the positions of the modules in the layout).

Also, when the cost-calculating method is the bipartitioning process 1000 described above, the process 2800 calls the process 900 before calling the process 1000. As described above, the process 900 defines a cut line for the current IC region being optimized by the optimization process 2800. The process 2800 supplies the congestion-calculating process 1000 with this cut line along with the initial-configuration's net list, in order to receive from the process 1000 the net-cut congestion cost (C) of the initial placement configuration. From the process 1000, the process 2800 also receives two net lists that specify the nets and the pins in the two regions defined by the current cut line.

After obtaining cost of the initial placement configuration at 2810, the process sets (at 2815) a futile-iteration counter (F) equal to 1. As further described below, the process uses counter to determine whether it needs to terminate its operation as it has performed a predetermined number of iterations without improving the score.

At 2815, the process also sets an annealing "temperature" T and iteration counter N. As further described below, the annealing temperature determines how likely the process 2800 will accept bad moves. The iteration counter is used to decrease this temperature over time, so as to make process 2800 less and less willing to accept bad moves.

At 2820, the process then (1) selects a random move that requires the modification of the coordinates of one or more circuit modules in the IC layout, and (2) increments the iteration counter N. The process next identifies (at 2825) all the nets affected by this random move. Depending on how nets are defined, these nets are the nets that either (1) contain the circuit module or modules selected for the move, or (2) contain the pins of these circuit modules.

At 2830, the process computes the current cost for the nets identified at 2825. As mentioned above, the cost calculating process 1000 stores the cost for each net. Hence, the process 2800 can compute the current cost for the identified nets by summing the stored cost values for these nets.

According to the selected random move, the process 2800 modifies (at 2835) the coordinates of each circuit module and/or pin affected by the move. In other words, at 2835, the process makes the move by modifying the coordinates of the affected circuit module or modules and/or their associated pins to match the random location identified at 2820.

The process then calls the cost-calculating process and supplies this process with a net list that specifies the identified nets that are affected by the selected move. This net list specifies the configuration of the identified nets after the selected move, since the process 2800 modified the coordinates of the affected circuit modules and/or pins at 2835. In the embodiments where the cost-calculating process is the bipartitioning process 1000, the process 2800 supplies this process 1000 with the cut line for the current IC region being optimized, along with the list of the identified nets.

In response to the call at 2840, the cost-calculating method computes and returns the cost (C) for the configuration of the identified nets after the potential modification. When the cost-calculating method is the bipartitioning process 1000, this process also partitions the identified nets about the cut line, and returns two net lists that reflect this partitioning.

After receiving (at 2840) the cost for the identified nets after the potential modification, the process generates (at 2845) a delta cost by subtracting the cost for the identified nets after the potential modification (i.e., the cost calculated at 2840) from the cost for the identified nets before the potential modification (i.e., the cost calculated at 2830).

At 2850, the process determines whether the delta cost is less than zero. If so, the selected move reduces the placement cost, and the process decides to retain the move. Specifically, when the delta cost is less than zero, the process resets (at 2855) the futile-iteration counter F to 1. The process then sets (at 2860) the cost of the current placement configuration (i.e., the placement configuration with the selected move) equal to the cost of the previous placement configuration (i.e., the placement configuration without the selected move) plus the delta cost. The delta cost is negative and thereby reduces the overall placement configuration cost C. The process 2800 uses (at 2865) the two net lists returned by the method 1000 at 2840 to modify the two net lists for the two sub-regions defined by the current cut line.

The process next determines (at 2870) whether the iteration counter N has reached a maximum. If not, the process returns to 2820 to select another random move. Otherwise, the process decreases the annealing temperature and resets the iteration counter at 2875, and then returns to 2820 to select another random move.

If the process determines (at 2850) that the delta cost is not less than zero, the process computes (at 2880) a probability between 0 and 1. In some embodiments, the equation for computing the probability equals $e^{-(Delta)/T}$, where Delta is the value computed at 2845 and T is the annealing temperature.

Next, the process picks (at 2882) a random number between 0 and 1. At 2884, the process then determines whether the random number is less than the computed probability. If so, the process decides to make the move, and thereby transitions to 2860 to perform the other operations associated with the move, as described above.

If the selected random number is not less than the computed probability, the process changes (at 2886) the coordinates of the affected circuit module or modules and/or their corresponding pins back to their original coordinates before the move (i.e., their coordinates before 2835). At 2886, the process also changes the cost of each of the identified nets back to its original value (i.e., back to the cost stored for the net before 2840).

The process then increments (at 2888) the futile-iteration counter by one. The process then determines (at 2890) whether the futile-iteration count equals a pre-specified maximum. If not, the process transitions to 2870, which was described above. Otherwise, the process realizes (at 2890) that it has performed a pre-specified maximum number of iterations without improving the placement score. Hence, the process returns (at 2892) a net list specifying the current placement configuration, and then ends.

C. KLFM

KLFM is an optimization technique that iteratively modifies the placement configuration to improve the placement score generated by a cost-calculating function. At each iteration, this technique might move one circuit module, swap two modules, move a number of related modules, etc. Unlike local optimization and simulated annealing, KLFM does not randomly select moves. Instead, at each iteration, it selects the best move over all the possible moves that it can make. KLFM will make moves that make the placement cost worse. Over an entire sweep, it then identifies the best placement configuration that it sees, and if that best placement configuration has a better cost than the original placement configuration, KLFM starts over with the improved solution.

Figure 29:
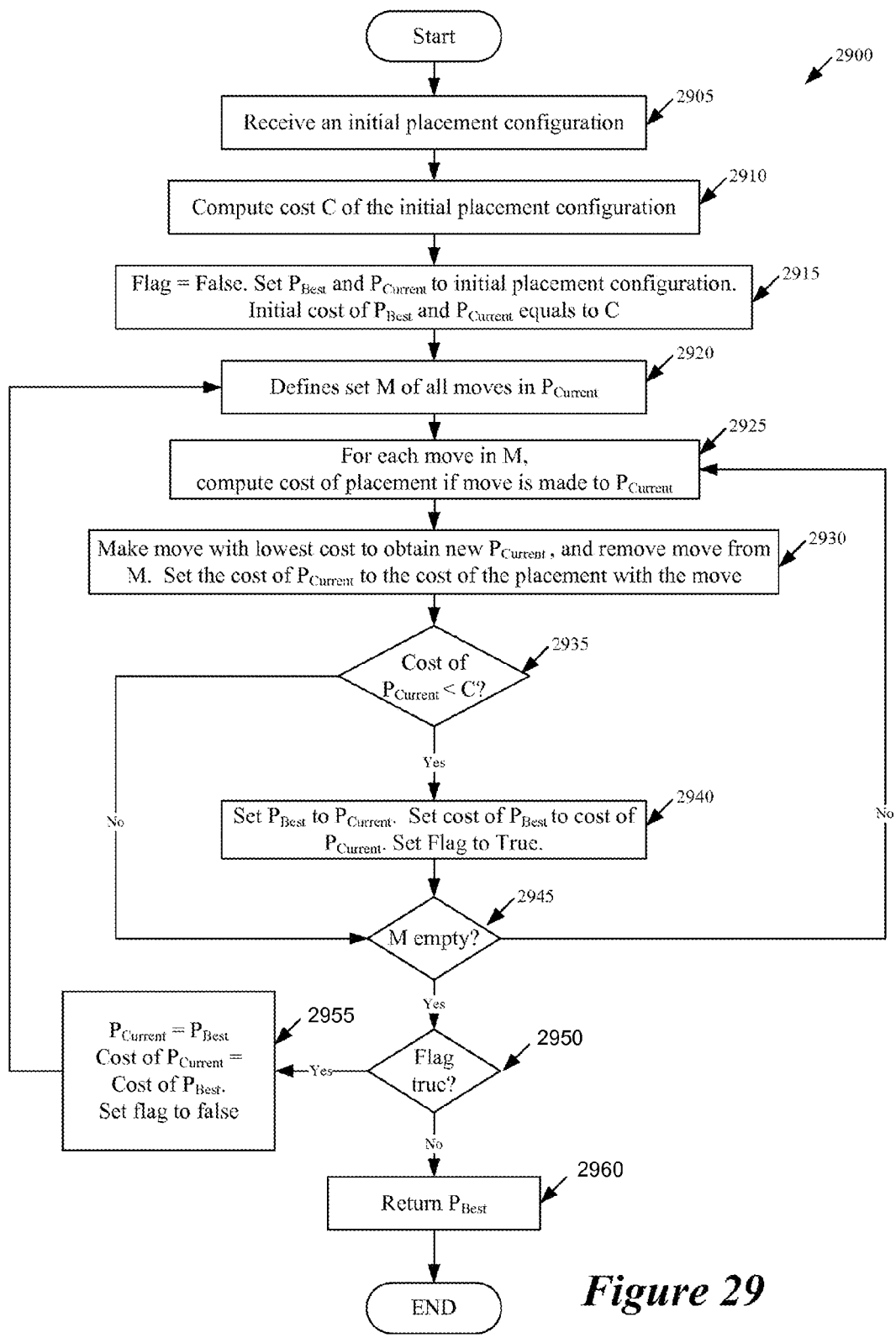
FIG. 29 illustrates one example of a KLFM process.

FIG. 29 illustrates one example of a KLFM process 2900. This process initially receives (at 2905) an initial placement configuration. In some embodiments, the process receives the initial configuration by receiving a list of circuit modules, a starting placement configuration for these modules, and a net list that specifies the interconnection between these modules.

After receiving the initial placement configuration, the process 2900 calls (at 2910) a cost-calculating method, like one of the cost-calculating methods described above in Section II. In response, this cost-calculating method computes and returns the cost (C) of the initial placement configuration.

When the process 2900 calls the cost-calculating method, it supplies this method with a net list that specifies the initial placement configuration (i.e., a net list that identifies all the nets in the IC layout before any modifications to the positions of the modules in the layout).

Also, when the cost-calculating method is the bipartitioning process 1000 described above, the process 2900 calls the process 900 before calling the process 1000. As described above, the process 900 defines a cut line for the current IC region being optimized by the optimization process 2900. The process 2900 supplies the congestion-calculating process 1000 with this cut line along with the initial-configuration's net list, in order to receive from the process 1000 the net-cut congestion cost (C) of the initial placement configuration. From the process 1000, the process 2900 also receives two net lists that specify the nets and the pins in the two regions defined by the current cut line.

After obtaining the cost of the initial placement configuration at 2910, the process sets (at 2915) a flag (F) equal to false. As further described below, the process uses this flag after performing a number of moves to determine whether any of the moves improved the placement-configuration score. At 2915, the process also (1) identifies the initial placement configuration as the current and best placement configurations, and (2) initializes the costs of the current and best configurations to the cost of the initial configuration.

Next, the process defines (at 2920) a set M of all moves in the current placement configuration ($P_{Current}$). For each move in M, the process computes (at 2925) the cost (C) of the placement configuration after the move. To compute the cost of each move, the process performs the following six operations. First, the process (1) identifies all the nets affected by the move, and (2) computes the current cost for the identified nets by summing the stored cost values for these nets. Second, the process modifies the coordinates of each circuit element affected by the move according to the move.

Third, it supplies the cost-calculating process with a net list that specifies the identified nets that are affected by the selected move. When the cost-calculating process is the bipartitioning process 1000, the process 2900 also supplies the cost-calculating process with the cut line for the current IC region. From the cost-calculating process, the process 2900 receives the cost for the identified nets after the potential move. When the cost-calculating process is the bipartitioning process 1000, the process 2900 also receives two net lists that represent the partitioning of the identified net list by the process 1000.

Fourth, after receiving the cost for the identified nets after the potential modification, the process generates a delta cost by subtracting the cost for the identified nets after the potential modification from the cost for the identified nets before the potential modification.

Fifth, the process generates the cost of the move by adding the computed delta cost to the cost of the current placement configuration. Sixth, the process (1) changes the coordinates of the affected circuit elements (modules and/or pins) back to their original coordinates before the move, and (2) changes the cost of each of the identified nets back to its original value before the move.

At 2930, the process makes the move with the lowest placement-configuration cost to obtain a new current placement configuration $P_{Current}$. At this stage, the process also removes the selected move from the set M of possible moves. The process also sets the cost of the current placement configuration equal to the cost of the placement after the move. Also, when the cost-calculating method is the bipartitioning method 1000, the process modifies (at 2930) the two net lists for the two sub-regions defined by the current cut line by using the two net lists returned by this method at 2925 for the move.

The process then determines (at 2935) whether the cost of the current placement configuration (i.e., the configuration obtained at 2930) is less than the lowest placement-configuration cost yet seen. If not, the process transitions to 2945, which will be described below. Otherwise, the process (at 2940) (1) defines the best placement configuration to be the current placement configuration, (2) sets the cost of the best placement configuration to the cost of the current placement configuration, and (3) sets the flag (F) to true to indicate that at least one of the performed moves improved the placement cost. The process then transitions to 2945.

At 2945, the process determines whether the set M of possible moves is empty. If not, the process transitions back to 2925 to compute, for each remaining move in the set, the cost (C) of the placement configuration after the move. The process recomputes the cost associated with the moves because the previous move might have affected the placement configuration costs for the remaining moves.

If the process determines (at 2945) that the set M is empty, the process determines that it has performed all the moves in the set defined at 2920. Consequently, the process determines (at 2950) whether one of the performed moves improved the placement cost by determining whether the flag (F) is set to true.

If the flag is true, the process (at 2955) (1) sets the current placement configuration equal to the best placement configuration identified in the last sweep through the moves, (2) defines the cost of the current placement configuration equal to the cost of the best placement configuration, and (3) sets the flag (F) to false. The process then returns to 2920 to repeat for the current placement configuration, in order to determine whether it can improve on this configuration.

If the process determines (at 2950) that the flag is false, the process returns (at 2960) the best placement configuration that it identified as the final placement configuration. The process then ends.

IV. Computer System

Figure 30:
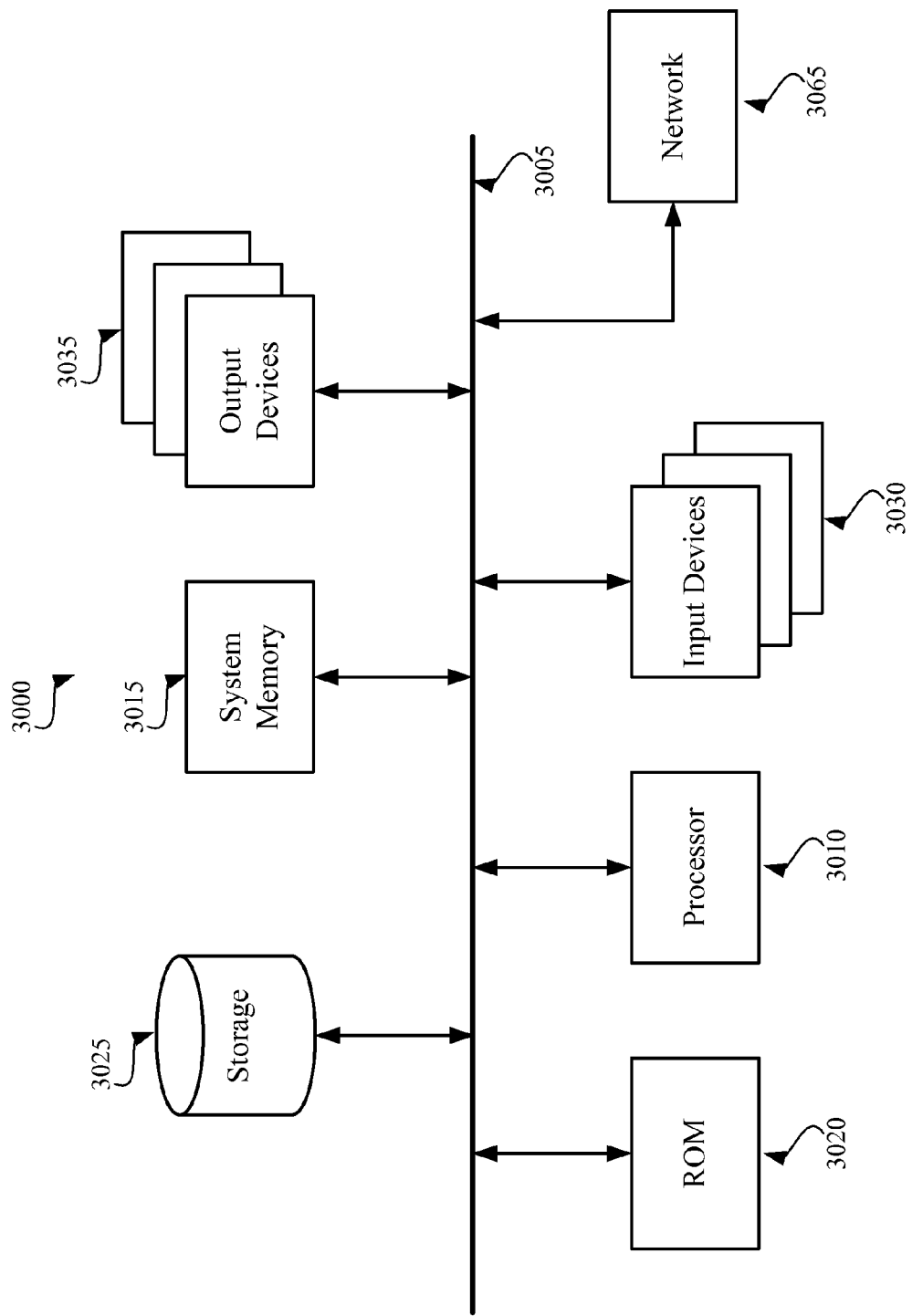
FIG. 30 illustrates a computer system used by some embodiments of the invention.

FIG. 30 conceptually illustrates a computer system with which some embodiments of the invention is implemented. Computer system 3000 includes a bus 3005, a processor 3010, a system memory 3015, a read-only memory 3020, a permanent storage device 3025, input devices 3030, and output devices 3035.

The bus 3005 collectively represents all system, peripheral, and chipset buses that support communication among internal devices of the computer system 3000. For instance, the bus 3005 communicatively connects the processor 3010 with the read-only memory 3020, the system memory 3015, and the permanent storage device 3025.

From these various memory units, the processor 3010 retrieves instructions to execute and data to process in order to execute the processes of the invention. The read-only-memory (ROM) 3020 stores static data and instructions that are needed by the processor 3010 and other modules of the computer system. The permanent storage device 3025, on the other hand, is a read-and-write memory device. This device is a non-volatile memory unit that stores instruction and data even when the computer system 3000 is off. Some embodiments of the invention use a mass-storage device (such as a magnetic or optical disk and its corresponding disk drive) as the permanent storage device 3025. Other embodiments use a removable storage device (such as a floppy disk or zip® disk, and its corresponding disk drive) as the permanent storage device.

Like the permanent storage device 3025, the system memory 3015 is a read-and-write memory device. However, unlike storage device 3025, the system memory is a volatile read-and-write memory, such as a random access memory. The system memory stores some of the instructions and data that the processor needs at runtime. In some embodiments, the invention's processes are stored in the system memory 3015, the permanent storage device 3025, and/or the read-only memory 3020.

The bus 3005 also connects to the input and output devices 3030 and 3035. The input devices enable the user to communicate information and select commands to the computer system. The input devices 3030 include alphanumeric keyboards and cursor-controllers. The output devices 3035 display images generated by the computer system. The output devices include printers and display devices, such as cathode ray tubes (CRT) or liquid crystal displays (LCD).

Finally, as shown in FIG. 30, bus 3005 also couples computer 3000 to a network 3065 through a network adapter (not shown). In this manner, the computer can be a part of a network of computers (such as a local area network ("LAN"), a wide area network ("WAN"), or an Intranet) or a network of networks (such as the Internet). Any or all of the components of computer system 3000 may be used in conjunction with the invention. However, one of ordinary skill in the art will appreciate that any other system configuration may also be used in conjunction with the invention.

While the invention has been described with reference to numerous specific details, one of ordinary skill in the art will recognize that the invention can be embodied in other specific forms without departing from the spirit of the invention. For example, the above mentioned cut graphs are described as approximations for diagonal cut lines. However, in some embodiments, these cut graphs may be implemented for other reasons. Moreover, other types of cut graphs may be used to approximate diagonal cut lines. Additionally, the above optimization techniques are described with reference to using cut lines. However, such optimization techniques may be used with various cut graphs. Furthermore, various mathematical procedures are described to determine on which side of a cut line a pin is located on. However, different embodiments may use different mathematical procedures. For instance, to determine on which side of a cut arc a pin is located on, some embodiments compute the squared value of the distance (i.e., $Dp^2$) between the pin and the center of circle that defines the circle and compare it with the squared value of the radius (i.e., $R^2$) of the circle. Thus, one of ordinary skill in the art would understand that the invention is not to be limited by the foregoing illustrative details, but rather is to be defined by the appended claims.

What is claimed is:

1. An automated method for placing a set of circuit modules in an integrated circuit ("IC") layout, the set of circuit modules comprising a plurality of pins, the method comprising:

computing a placement metric for the IC layout, wherein computing the placement metric comprises partitioning a region of the IC layout into a plurality of sub-regions by using a cut graph, wherein the cut graph is used to partition the IC layout around a geometric object of the IC layout, wherein the cut graph comprises at least two orthogonal segments defined to go about a periphery of the geometric object in a way to ensure that no pins are between the cut graph and the geometric object; and by a computer, determining a placement for the set of circuit modules based on the computed placement metric.

2. The automated method of claim 1, wherein the cut graph further comprises a first diagonal cut line, wherein the first diagonal cut line is coupled to a first end of a first of said orthogonal segments.

3. The automated method of claim 2, wherein the cut graph further comprises a second diagonal cut line, wherein the second diagonal cut line is coupled to a second end of a second of said orthogonal segments.

4. The automated method of claim 3, wherein the geometric object comprises an L-shaped block.

5. The automated method of claim 1, wherein the geometric object is a fixed module that cannot be moved in the IC layout.

6. The automated method of claim 1, wherein computation of the placement metric further comprises determining a number of nets cut by the cut graph.

7. The automated method of claim 1, wherein the cut graph comprises (1) a plurality of orthogonal segments comprising a plurality of vertical segments and a plurality of horizontal segments and (2) a plurality of diagonal segments, wherein at least one end of each diagonal segment is coupled to one of said plurality of orthogonal segments.

8. The automated method of claim 1, wherein the cut graph is a combination of a diagonal cut line and a staircase cut graph.

9. The automated method of claim 8, wherein the staircase cut graph is used to go about the periphery of the geometric object.

10. A non-transitory computer readable medium storing a computer program for placing a set of circuit modules in an integrated circuit ("IC") layout, the set of circuit modules comprising a plurality of pins, the computer program executable by at least one processor, the computer program comprising sets of instructions for:

computing a placement metric for the IC layout, wherein the set of instructions for computing the placement metric comprises a set of instructions for partitioning a region of the IC layout into a plurality of sub-regions by using a cut graph, wherein the cut graph is used to partition the IC layout around a geometric object of the IC layout, wherein the cut graph comprises at least two orthogonal segments defined to go about a periphery of the geometric object in a way to ensure that no pins are between the cut graph and the geometric object; and determining a placement for the set of circuit modules based on the computed placement metric.

11. The non-transitory computer readable medium of claim 10, wherein the geometric object cannot be moved more than a particular value in the IC layout, wherein the particular value is less than a value required for preventing a particular diagonal cut line and the geometric object from surrounding a pin of the IC layout.

12. The non-transitory computer readable medium of claim 10, wherein the geometric object represents an electronic component in the IC layout.

* * * * *